US010481701B2

(12) United States Patent
Kawamura et al.

(10) Patent No.: US 10,481,701 B2
(45) Date of Patent: Nov. 19, 2019

(54) OPERATION INPUT DEVICE

(71) Applicant: Murata Manufacturing Co., Ltd., Nagaokakyo-shi, Kyoto-fu (JP)

(72) Inventors: Hideki Kawamura, Nagaokakyo (JP); Nobuhito Tsubaki, Nagaokakyo (JP); Fumiya Isono, Nagaokakyo (JP); Takafumi Inoue, Nagaokakyo (JP); Takashi Kihara, Nagaokakyo (JP); Jun Endo, Nagaokakyo (JP); Masato Saito, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 119 days.

(21) Appl. No.: 15/608,233

(22) Filed: May 30, 2017

(65) Prior Publication Data

US 2017/0262066 A1 Sep. 14, 2017

Related U.S. Application Data

(63) Continuation of application No. PCT/JP2015/086171, filed on Dec. 25, 2015.

(30) Foreign Application Priority Data

Dec. 26, 2014 (JP) .................................. 2014-264007
Nov. 17, 2015 (JP) ..................... PCT/JP2015/082185

(51) Int. Cl.
*G06F 3/02* (2006.01)
*H01H 3/02* (2006.01)
(Continued)

(52) U.S. Cl.
CPC .............. *G06F 3/02* (2013.01); *A44C 5/0053* (2013.01); *H01H 3/02* (2013.01); *H01H 13/04* (2013.01)

(58) Field of Classification Search
CPC .......... G06F 3/02; G06F 1/163; G06F 3/0414; A44C 5/0053; H01H 3/02; H01H 13/04; H03K 17/964
See application file for complete search history.

(56) References Cited

U.S. PATENT DOCUMENTS

| 6,590,835 B2 | 7/2003 | Farine et al. |
| 2001/0050883 A1 | 12/2001 | Farine et al. |
| 2014/0310636 A1* | 10/2014 | Arrasvuori ................ G06F 3/01 715/771 |

FOREIGN PATENT DOCUMENTS

| JP | S61-202089 U | 12/1986 |
| JP | S62-160396 U | 10/1987 |

(Continued)

OTHER PUBLICATIONS

International Search Report issued in International Application No. PCT/JP2015/086171, dated Feb. 9, 2016.
(Continued)

*Primary Examiner* — Bryan Bui
(74) *Attorney, Agent, or Firm* — Arent Fox LLP

(57) ABSTRACT

An operation input device having an exterior portion that includes a band portion extending in a belt shape and having flexibility and a housing; and a control unit (23) that is housed in the exterior portion and performs input processing based on a detection signal indicating detection of a predetermined operation. The operation input device is provided with a deformation detection unit that outputs a detection signal associated with a deformation of the band portion or a deformation of the housing to the control unit.

12 Claims, 22 Drawing Sheets

(51) Int. Cl.
*H01H 13/04* (2006.01)
*A44C 5/00* (2006.01)

(56) References Cited

FOREIGN PATENT DOCUMENTS

| | | |
|---|---|---|
| JP | 3063339 U | 8/1999 |
| JP | 2002-49458 A | 2/2002 |
| JP | 2002-148367 A | 5/2002 |
| JP | 2006-38710 A | 2/2006 |
| JP | 2013-8311 A | 1/2013 |

OTHER PUBLICATIONS

Written Opinion of the International Searching Authority issued in International Application No. PCT/JP2015/086171, dated Feb. 9, 2016.

* cited by examiner

FIG. 1(A)
FIG. 1(B)
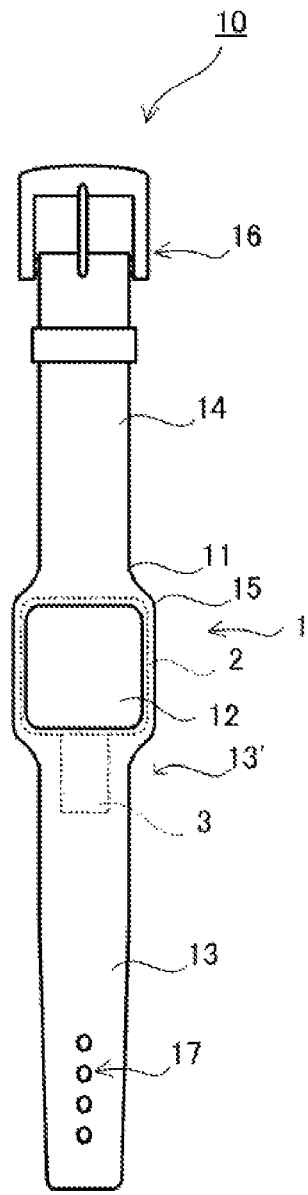
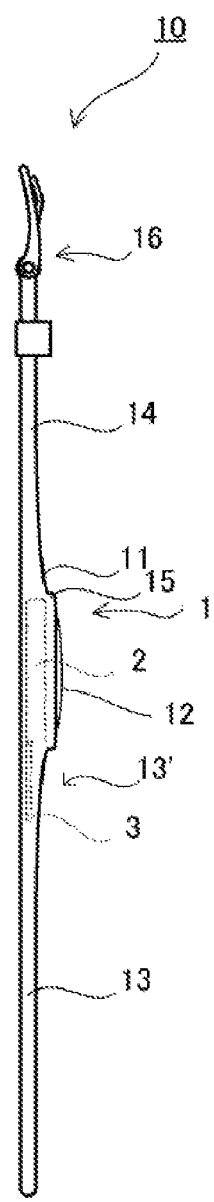

FIG. 9(A)
FIG. 9(B)
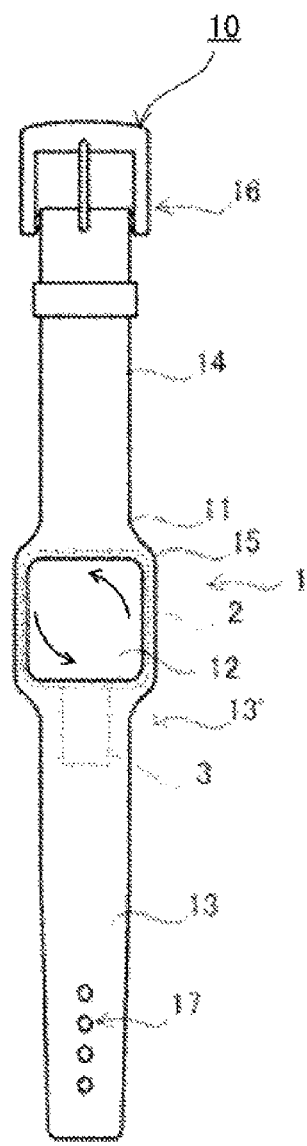
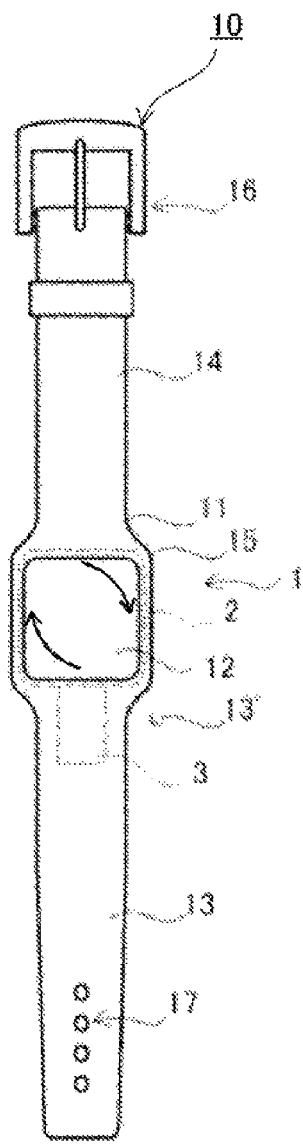

OPERATION INPUT DEVICE

CROSS REFERENCE TO RELATED APPLICATIONS

The present application is a continuation of International application No. PCT/JP2015/086171, filed Dec. 25, 2015, which claims priority to International application No. PCT/JP2015/082185, filed Nov. 17, 2015 and Japanese Patent Application No. 2014-264007, filed Dec. 26, 2014, the entire contents of each of which are incorporated herein by reference.

FIELD OF THE INVENTION

The present invention relates to an operation input device that accepts operation of an operator, and particularly relates to an operation input device including a band portion with flexibility.

BACKGROUND OF THE INVENTION

Recently, wristband-type information terminals and wristwatch-type information terminals have been widespread. Such information terminals need to accept operation from operators. A touch panel may then be attached to a display unit in each of the wristband-type and wristwatch-type information terminals. However, when the touch panel is attached to the display unit, a fingerprint is left on the display unit by touching it with a finger, and the display unit is hidden by the finger to impair the visibility at the time of operation, which have been problematic.

Because of this, in each of the wristband-type and wristwatch-type information terminals, a button switch is then provided in a bezel portion or a band portion (e.g., see Patent Document 1, Patent Document 2).

Patent Document 1: Japanese Patent Application Laid-Open No. 2002-049458

Patent Document 2: Japanese Patent Application Laid-Open No. 2002-148367

SUMMARY OF THE INVENTION

When the button switch is to be attached to each of the wristband-type and wristwatch-type operation input devices, the size of the button-type switch cannot be made so large. There have thus been cases where the operability of the button switch is impaired, and it takes time to confirm the position of the button switch at the time of operation. Further, with each of the wristband-type and wristwatch-type operation input devices being mounted on a soft region such as a wrist, there have also been cases where, even when the operator has intended to hold down the button switch with his or her finger, a band part is warped and the button switch thus cannot be held down. Hence, in each of the conventional wristband-type and wristwatch-type operation input devices, it has been difficult to perform reliable input unless the operator is careful with the operation.

It is therefore an object of the present invention to provide an operation input device easily and reliably operable by the operator.

Embodiments of the present invention include an operation input device provided with an exterior portion that includes a housing and a band portion extending in a belt shape; a control unit that is housed in the exterior portion and performs input processing based on a detection signal; and a deformation detection unit that is disposed in the band portion or the housing and outputs a detection signal associated with deformation of the band portion or deformation of the housing to the control unit.

With this configuration, when the exterior portion is subjected to an external force and the band portion or the housing is deformed, the deformation detection unit outputs a detection signal. In the operation input device with this configuration, the operator can instinctively (haptically) touch the exterior portion to apply an external force thereto even without visually confirming the exterior portion, and hence the operator can perform operation in an easy and reliable manner.

It is preferable that the deformation detection unit be disposed in the band portion and output a detection signal based on a directionality of the deformation that occurs in the band portion, and the control unit performs processing in accordance with the detection signal.

With this configuration, it is possible to increase the kinds of operation detectable by the operation input device. For example, operations associated with different deformation directionality, such as pushing down the band portion or separating the band portion from his or her wrist or the like, can be detected in a distinguishable manner.

In the operation input device, it is preferable that the exterior portion include a body portion that is more resistant to warpage than the band portion and houses the control unit, the deformation detection unit is disposed in the band portion, the band portion includes a first part adjacent to a first edge of the body portion in an extending direction of the band portion, and a second part adjacent to a second edge of the body portion in the extending direction of the band portion, and the deformation detection unit is attached to the first part of the band portion.

With this configuration, even when the second part of the band portion receives operation, deformation associated with the operation is transmitted from the second part to the first part through the body portion. This enables not only detection of operation received by the first part of the band portion in the first deformation detection unit, but also detection of operation received by the second part of the band portion in the deformation detection unit. When the body portion is provided, at the time of transmission of a certain kind of deformation to a part opposite from the band portion through the body portion, the directionality of the deformation is reversed. For example, when the operator performs operation so as to push down the second part of the band portion, at the time of transmission of deformation associated with that operation to the first part of the band portion through the body portion, the directionality of the deformation is reversed, and in the first part of the band portion, such deformation as to separate the band portion from the wrist or the like occurs. This enables distinguishable detection between operation on the first part of the band portion and operation on the second part of the band portion.

The operation input device may further include a second deformation detection unit attached to the second part of the band portion. The first deformation detection unit may sense a first form of deformation of the band portion, and the second deformation detection unit may also sense the first form of deformation of the band portion.

With this configuration, operation performed on the first part of the band portion and operation performed on the second part of the band portion can be separately accepted in the first deformation detection unit and the second deformation detection unit, respectively, to enhance the accuracy in detection of the respective operations.

The first deformation detection unit may sense a first form of deformation of the band portion, and the second deformation detection unit may sense a second form of deformation of the band portion different from the first form of deformation.

With this configuration, it is possible to increase the kinds of forms of deformation of the band portion which are detectable by the operation input device, namely the kinds of detectable operation.

The operation input device may further include a third deformation detection unit in the first part of the band portion in addition to the first deformation detection unit. The first deformation detection unit may sense a first form of deformation of the band portion, and the third deformation detection unit may sense a second form of deformation of the band portion different from the first form of deformation.

Also with this configuration, it is possible to increase the kinds of form of deformation of the band portion which are detectable by the operation input device, namely the kinds of detectable operation.

It is preferable that the deformation detection unit include a piezoelectric film that configured to be deformed in a stretching or contracting direction due to deformation of the band portion so as to generate a charge, and that the piezoelectric film is disposed and wired so as to sense a bending deformation of the band portion.

With this configuration, it is possible to detect such operation as to act an external force in a bending direction on the band portion, for example, operation of the operator pushing down a part attached with a piezoelectric film in the band portion onto a mounted portion such as the wrist or the like, or operation of the operator separating that part from the wrist or the like.

It is preferable that the piezoelectric film extend from a connecting part of the band portion with the body portion in a direction away from the body portion, and have a length larger than 5 mm. Further, it is desirable that the length of the piezoelectric film is 7 to 31 mm. It is particularly desirable that the length of the piezoelectric is 15 mm to 25 mm.

With this configuration, such operation as to push down a vicinity of a connecting part of the band portion with the body portion by a fingertip can be detected with favorable sensitivity. When the length of the piezoelectric film is excessively small, a charge generated in the piezoelectric film itself is undesirably small. When the length of the piezoelectric film is excessively large, charges are undesirably generated respectively on the housing end and the opposite end of a contacting position of the band portion with the finger in the piezoelectric film so as to cancel each other. Thus, by setting the length of the piezoelectric film so as to be held in the above range, such operation as to push down the vicinity of the connecting part of the band portion with the body portion by the fingertip can be detected with favorable sensitivity, as described above.

It is preferable that the deformation detection unit include a piezoelectric film that is configured to be deformed in a stretching or contracting direction due to deformation of the band portion to generate an electric charge, and that the piezoelectric film is disposed and wired so as to sense a twisting deformation of the band portion around a lengthwise axis of the band portion.

With this configuration, it is possible to detect such operation as to act an external force in a twisted direction on the band portion, for example, operation of the operator placing his or her finger on the side face of the band portion or the case portion and raising the exterior portion from one side face end thereof.

It is preferable that the deformation detection unit be disposed in each of the housing and the band portion.

With this configuration, twisting can be detected more accurately.

It is preferable that the housing have a bottom face and a side face, and that the deformation detection unit is provided on the side face.

With this configuration, operation can be easily performed on the side face of the housing as compared with the bottom face of the housing. Hence the operator's operability can be improved with this configuration.

It is preferable that the operation input device include an acceleration sensor that detects whether or not the operation input device is moving, and the control unit turns on the acceleration sensor based on the output of the deformation detection unit.

With this configuration, power consumption can be reduced as compared with the case of constantly operating both the deformation detection unit and the sensor.

It is preferable that the operation input device include an acceleration sensor that detects whether or not the operation input device is moving, and the control unit turns on the deformation detection unit based on the output of the acceleration sensor.

With this configuration, power consumption can be reduced as compared with the case of constantly operating both the deformation detection unit and the sensor.

According to this invention, operation of the exterior portion associated with deformation of the band portion is detected, and hence the operator can perform operation of the operation input device by instinctively (haptically) touching the exterior portion to apply an external force thereto even without visually confirming the exterior portion.

BRIEF EXPLANATION OF THE DRAWINGS

FIGS. 1(A) and 1(B) are a plan view and a side view of an operation input device according to a first embodiment of the present invention.

FIGS. 9(A) and 9(B) are front views showing a form of deformation by operation of the operation input device according to the second embodiment of the present invention.

DETAILED DESCRIPTION OF PREFERRED EMBODIMENTS OF THE INVENTION

Figure 2:
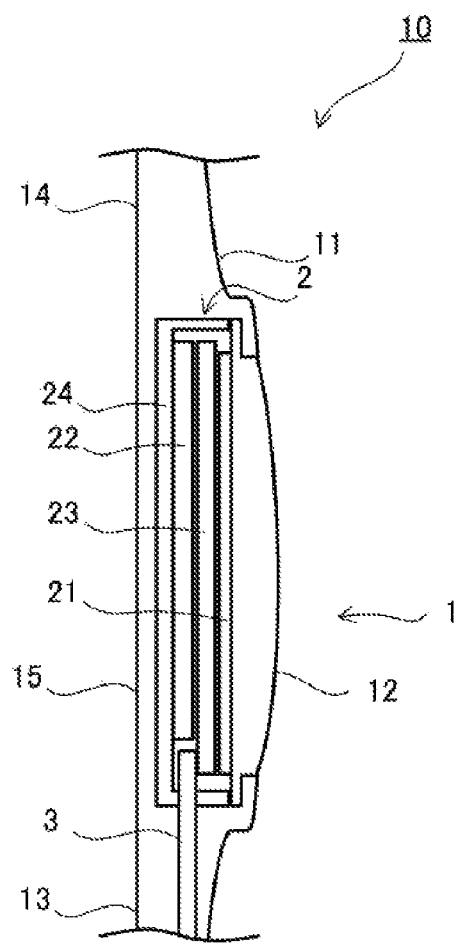
FIG. 2 is a side view of the operation input device according to the first embodiment of the present invention.

Hereinafter, an operation input device according to a first embodiment of the present invention will be described in relation to a wristwatch-type terminal (information terminal) as an example, with reference to the drawings. Note that the operation input device according to the present invention is not restricted to the wristwatch-type terminal, but can be adopted to a terminal of choice which is mounted on a human body, such as a wristband-type terminal or a ring terminal.

FIG. 1(A) is a front view of an information terminal 10 according to the first embodiment of the present invention. FIG. 1(B) is a side view of the information terminal 10.

The information terminal 10 includes an exterior portion 1, an electric module unit 2, and a deformation detection unit 3. The exterior portion 1 includes a band portion 11 and a glass portion 12. The band portion 11 includes a first belt portion 13, a second belt portion 14, and a case portion 15. Here, the band portion 11, namely the first belt portion 13 and the second belt portion 14, and the case portion 15 are integrally molded by a resin member having elasticity, such as silicone rubber. Note that in the present description, the electric module unit 2 may also be referred to as the body portion.

The case portion 15 has a shape having an internal space for housing the electric module unit 2, such as a box shape provided with an opening on its front, or a cylindrical shape provided with an opening on its front and back, and is larger in thickness-wise dimension than the first belt portion 13 and the second belt portion 14. The glass portion 12 is in the shape of a lid to be fitted into the front-end opening of the case portion 15. When the front face of the electric module unit 2 is configured having a simple display segment, the glass portion 12 may not necessarily be provided.

Each of the first belt portion 13 and the second belt portion 14 is in a belt shape having edges and thickness-wise flexibility, and is smaller in thickness-wise dimension than the case portion 15. The upper edge of the first belt portion 13 is connected to the lower edge-end side face of the case portion 15. The lower edge of the second belt portion 14 is connected to the upper edge-end side face of the case portion 15. The connection among the first belt portion 13, the second belt portion 14, and the case portion 15 may be achieved by separately constituting those portions and then connecting them by a hinge structure, other than integrally molding them by the resin member with elasticity.

A buckle portion 16 and locking holes 17 are provided at the edges opposite from the connecting edges of the first belt portion 13 and the second belt portion 14 with the case portion 15. Locking the buckle portion 16 to the locking hole 17 annularly couples the first belt portion 13, the second belt portion 14, and the case portion 15.

Note that the band portion 11 may be configured in the shape of a belt coupling the belt portions 13, 14 with each other by the buckle portion 16, or other than that, if the band portion 11 can be mounted so as to be in contact with the human body, it may be configured as in an edgeless (annular) shape or a spiral shape with an expandable opening diameter. Further, the band portion 11 may be configured so as to be mounted on a finger, an ankle, a neck, or the like, other than a wrist.

In the present embodiment, one deformation detection unit 3 is built in a part (first part 13') of the first belt portion 13 which is adjacent to the case portion 15. The deformation detection unit 3 is in a belt shape being small thickness-wise in the first belt portion 13 and long in the extending direction of the first belt portion 13. The longitudinal dimension of the deformation detection unit 3 is preferably smaller than, and not larger than a half of, the longitudinal dimension of the first belt portion 13.

The first belt portion 13 has an internal space for housing the deformation detection unit 3. This internal space can be formed by injection molding of a part for the first belt portion 13, or by secondary processing (cutting processing) after the injection molding, or by prevention of partial coupling at the time of coupling between resin members subjected to the injection molding.

FIG. 2 is a side sectional view showing the case portion 15 and the electric module unit 2 of the information terminal 10 and a surrounding area thereof.

The electric module unit 2 includes a display 21, a power supply 22, a control unit 23, and a housing 24. The housing 24 is in a box shape or a cylindrical shape being open on at least its front, and houses the power supply 22 and the control unit 23 on its inside. The display 21, the power supply 22, and the control unit 23 are wired and connected with one another. The power supply 22 supplies power to the display 21 and the control unit 23. Specifically, the power supply 22 is made up of a button battery, a battery pack, a re-generation unit, a solar generation unit, or the like. The display 21 is electrically connected with a control unit 23, and has a function of displaying and specifying a variety of information based on a control signal inputted from the control unit 23. Specifically, the display 21 is configured as a liquid crystal panel, an organic electroluminescence (EL) display panel, a panel having a display segment, a dial-plate attached with an electrically controllable indication pointer, or some other panel. The control unit 23 is electrically connected with the deformation detection unit 3, and is constructed to perform display control processing while performing appropriate input processing based on a detection signal indicating detection of a predetermined operation in the deformation detection unit 3 as described below. The control unit 23 includes components such as a power supply controller, a display controller, an amplification circuit for amplifying signals from the deformation detection unit 3, and a processor programmed to carry out the signal processing for the touch operations described herein. An electrical connection structure of the control unit 23 and the deformation detection unit 3 can be formed by adopting an appropriate method such as a jumper wire, a connector, or connection between electrodes.

Note that bezel parts of the foregoing displays 21 and case portion 15, and the side face of the case portion 15 may be provided with operation inputting means such as a button switch and a touch sensor, not shown.

Figure 3A:
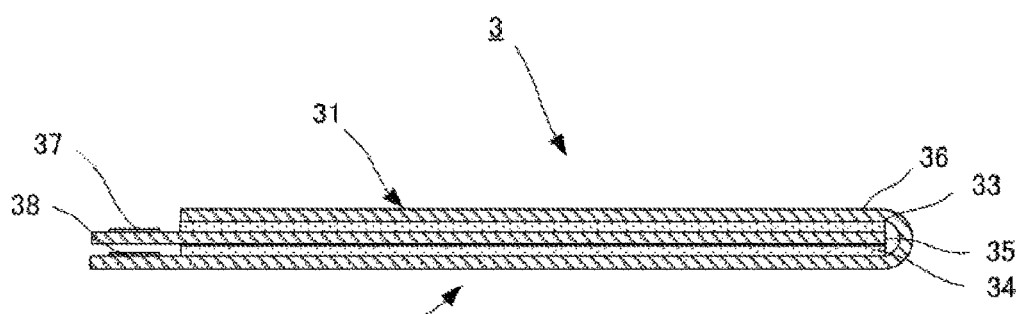
FIGS. 3(A) and 3(B) are a side view and a plan view of a deformation detection unit included in the operation input device according to the first embodiment of the present invention.
Figure 3B:
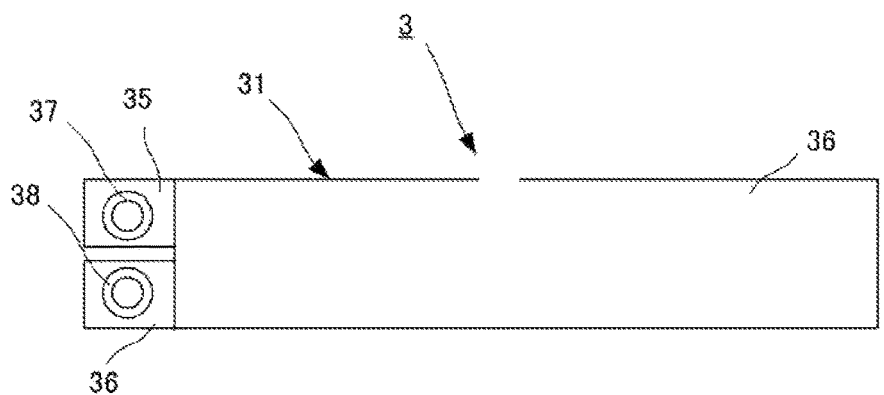

FIG. 3(A) is a side view of the deformation detection unit 3. FIG. 3(B) is a plan view of the deformation detection unit 3.

The deformation detection unit 3 has a top face 31 and a bottom face 32 as laminated faces to be laminated with the first belt portion 13, and outputs a detection signal to the control unit 23 based on deformation of the top face 31 and the bottom face 32. In the present embodiment, the deformation detection unit 3 is configured so as to have the sensitivity to bending deformation orthogonal to the top face 31 and the bottom face 32.

Specifically, the deformation detection unit 3 includes piezoelectric films 33, 34, a signal electrode 35, and a reference potential electrode 36. The piezoelectric films 33, 34, the signal electrode 35, and the reference potential electrode 36 are each in a belt shape having a longitudinal direction and transverse direction in a plan view and being small thickness-wise, and are laminated and coupled with one another.

The signal electrode 35 is formed by stamping sheet-shaped copper foil with a thickness of about 10 μm into a predetermined shape. A longitudinal edge end of the signal electrode 35 includes a connection portion 37 exposed thickness-wise, and projects from the edge faces of the piezoelectric films 33, 34, and the reference potential electrode 36.

The piezoelectric films 33, 34 are made of polylactic acid (PLA), and more specifically, L-shaped polylactic acid (PLLA) subjected to stretching processing, and are cut out such that a longitudinal direction on the film face forms an angle of 45° with respect to a main stretching direction. The piezoelectric film 33 is laminated on the top face 31-end signal electrode 35. The piezoelectric film 34 is laminated on the bottom face 32-end signal electrode 35.

The reference potential electrode 36 is laminated on each of the top and bottom of the laminate of the signal electrode 35 and the piezoelectric films 33, 34, and the upper and lower reference potential electrodes 36 are electrically connected with each other. Here, the reference potential electrode 36 is configured as a film made of a relatively soft conductive material such as conductive non-woven fabric or a silver pasted urethane film, and the upper and lower reference potential electrodes 36 are configured by folding back one sheet of film. A longitudinal edge end of the reference potential electrode 36 includes a connection portion 38 exposed thickness-wise, and projects from the edge faces of the piezoelectric films 33, 34, and the signal electrode 35.

Note that the deformation detection unit 3 may be configured including a protective film (not shown) that externally covers the top face 31, the bottom face 32, and the reference potential electrode 36. The protective film is preferably a foamable film, a urethane film, a thin polyethylene terephthalate (PET) film (a PET film with a thickness of about 12 μm), or the like.

Then, the piezoelectric films 33, 34 have the characteristic of having the same direction of polarization generated with respect to longitudinal stretching or contraction. That is, due to charges generated in the piezoelectric film 33 and the piezoelectric film 34 when the deformation detection unit 3 stretches longitudinally, the top face 31-end piezoelectric film 33 and the top face 31-end piezoelectric film 34 have the same electrical polarity, and the bottom face 32-end piezoelectric film 33 and the bottom face 32-end piezoelectric film 34 have the opposite electrical polarity to the above electrical polarity. The signal electrode 35 is laminated so as to be shared on the bottom face 32-end piezoelectric film 33 and the top face 31-end piezoelectric film 34 which are to have the opposite electrical polarities to each other when the deformation detection unit 3 stretches longitudinally. Further, the reference potential electrode 36 is laminated so as to be shared on the top face 31-end piezoelectric film 33 and the bottom face 32-end piezoelectric film 34 which are to have the opposite electrical polarities to each other when the deformation detection unit 3 stretches longitudinally. Accordingly, when the deformation detection unit 3 stretches longitudinally, the charges generated in the piezoelectric films 33, 34 are canceled in each of the signal electrode 35 and the reference potential electrode 36.

Meanwhile, when the deformation detection unit 3 is bent and deformed thickness-wise, one of the piezoelectric film 33 and the piezoelectric film 34 stretches longitudinally and the other contracts longitudinally. Thus, due to charges generated in the piezoelectric films 33, 34, the top face 31-end piezoelectric film 33 and the bottom face 32-end piezoelectric film 34 have the same electrical polarity, and the bottom face 32-end piezoelectric film 33 and the top face 31-end piezoelectric film 34 have the opposite electrical polarity to the above electrical polarity. The signal electrode 35 is laminated so as to be shared on the bottom face 32-end piezoelectric film 33 and the top face 31-end piezoelectric film 34 which are to have the same electrical polarities as each other when the deformation detection unit 3 is bent and deformed thickness-wise. Further, the reference potential electrode 36 is laminated so as to be shared on the top face 31-end piezoelectric film 33 and the bottom face 32-end piezoelectric film 34 which are to have the same electrical polarities as each other when the deformation detection unit 3 is bent and deformed thickness-wise. Accordingly, when the deformation detection unit 3 is bent and deformed thickness-wise, the charges generated in the piezoelectric films 33, 34 are not canceled and a detection signal is formed in the signal electrode 35 and the reference potential electrode 36.

Accordingly, in this deformation detection unit 3, it is possible to detect only thickness-wise bending deformation without detecting longitudinal stretching.

Characteristics of the PLLA for forming the piezoelectric films 33, 34 will be simply described here.

The PLLA is made of chiral polymer. A main chain of the PLLA has a helical structure. Thus, in a PLLA film, molecules are oriented in a uniaxially stretched direction, and have piezoelectricity due to the molecule orientation. On the film face of the uniaxially stretched PLLA film, such distortion occurs as to stretch in a direction of 45° with respect to the stretched direction, to generate a charge. An amount of charge generated at this time depends on a distortion amount of the film. A piezoelectric constant of the uniaxially stretched PLLA belongs to a group of very high piezoelectric constants among polymers. For example, a piezoelectric distortion constant d14 of the PLLA takes a high value of 10 to 20 pC/N by adjusting conditions such as stretching conditions, heating treatment conditions and additive blending. Note that the stretching ratio of the PLLA film is preferably about three to eight times. Performing heat treatment after stretching encourages crystallization of extended chain crystal of polylactic acid, to improve the piezoelectric constant. In the case of biaxial stretching, it is possible to obtain the same effect as that of uniaxial stretching by varying stretch ratios of the respective axes. For example when a sheet is stretched eight times in a given direction as an X axis direction and is stretched two times in a Y axis direction orthogonal to the X axis, it is possible to provide substantially the same effect of the piezoelectric constant as that obtained when a sheet is uniaxially stretched four times in the X axis direction. Since a simply uniaxially stretched sheet is likely to be broken in a stretching axis direction, it is possible to increase the strength to some extent by biaxially stretching the PLLA as described above.

Further, the PLLA produces the piezoelectricity by molecular orientation processing by way of stretching or the like, and thus does not need to be subjected to poling processing unlike other polymers such as polyvinylidene difluoride (PVDF) or a piezoelectric ceramics. That is, the piezoelectricity of the PLLA which does not belong to a ferroelectric is not exhibited by ion polarization unlike ferroelectrics such as PVDF or lead zirconate titanate (PZT), and derives from a helical structure which is a characteristic structure of molecules. For this reason, the piezoelectric constant of PVDF and the like temporally fluctuates and remarkably lowers depending on cases, but the piezoelectric constant of PLLA is temporally very stable. Hence an output charge amount is not influenced by a surrounding environment. The PLLA also has a major characteristic of not producing pyroelectricity that is produced in other ferroelectric piezoelectric bodies, thus having little possibility to generate a charge associated with a temperature change and erroneously detect it as output of the sensor.

Figure 4A:
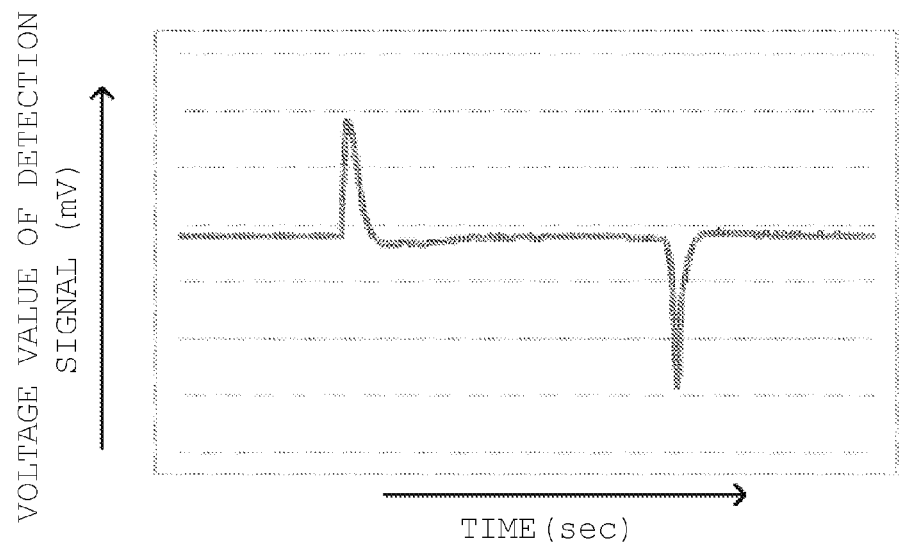
FIGS. 4(A) and 4(B) are graphs showing detection signals of the operation input device according to the first embodiment of the present invention.
Figure 4B:
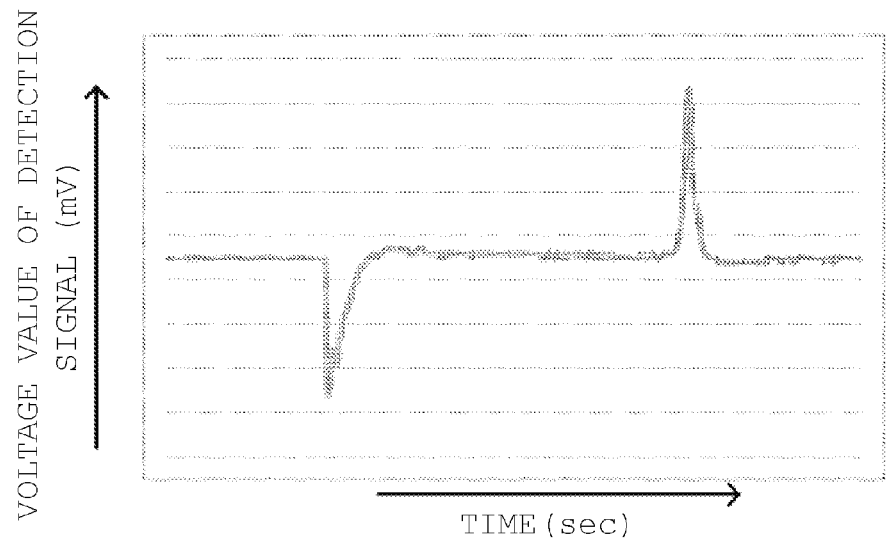

FIGS. 4(A) and 4(B) are graphs each illustrating a temporal change in potential of a detection signal outputted by the deformation detection unit 3. The deformation detection unit 3 outputs a different detection signal in accordance with the directionality of deformation that occurs on the top face 31 and the bottom face 32.

For example, the operator applies an external force to the tip of the deformation detection unit 3 in the direction of pushing down from the top face 31 end for a certain time to deform the top face 31-end deformation detection unit 3 into a projection and the bottom face 32-end deformation detection unit 3 into a depression. In this case, as shown in FIG. 4(A), a potential difference from a reference potential in the detection signal of the deformation detection unit 3 becomes a first polarity (e.g., +) at the moment of the external force starting to be applied to the deformation detection unit 3, and the potential difference from the reference potential becomes a second polarity (e.g., −) at the moment of the external force being removed from the deformation detection unit 3.

Further, the operator applies an external force to the tip of the deformation detection unit 3 in the direction of pushing down from the bottom face 32 end for a certain time to deform the top face 31-end deformation detection unit 3 into a depression and the bottom face 32-end deformation detection unit 3 into a projection. In this case, as shown in FIG. 4(B), the potential difference from the reference potential in the detection signal of the deformation detection unit 3 becomes the second polarity (e.g., −) at the moment of the external force starting to be applied to the deformation detection unit 3, and the potential difference from the reference potential becomes the first polarity (e.g., +) at the moment of the external force being removed from the deformation detection unit 3.

As thus described, in the deformation detection unit 3, the polarity of the potential difference from its reference potential in the detection signal changes in accordance with the directionality of the external force. Accordingly, the use of this deformation detection unit 3 allows grasping of the difference in directionality of deformation that occurs in the deformation detection unit 3 based on the polarity of the potential difference from the reference potential in the detection signal. Further, the use of this deformation detection unit 3 allows discrimination and detection of deformation (operation) in such two places where deformation with different directionalities occur in the deformation detection unit 3 even when the deformation detection unit 3 is provided at one position. Specifically, in the information terminal 10 shown in FIG. 1, the deformation detection unit 3 provided in the first belt portion 13 can discriminate and detect not only deformation in the first belt portion 13 but also deformation in the second belt portion 14.

Note that the potential difference from the reference potential in the detection signal occurs in accordance with the speed at which the external force changes, and the potential difference increases when the external force changes rapidly, while the potential difference decreases when the external force changes gently. Accordingly, the use of the deformation detection unit 3 allows grasping of a change in speed in the external force that is applied to the top face 31 and the bottom face 32 of the deformation detection unit 3, based on the detection signal. It is thus possible to vary the kind of control (input processing) in accordance with the speed of change in the external force by determining the potential difference of the detection signal by using a threshold or the like.

In the information terminal 10 using the deformation detection unit 3 as described above, the operator can bend and deform the first belt portion 13 and the laminated faces of the deformation detection unit 3 by instinctively (haptically) touching the exterior portion 1 to apply an external force thereto even without visually confirming the exterior portion 1. The operator can thus operate the information terminal 10 in an easy and reliable manner.

Note that a touch sensor such as a capacitance sensor may further be disposed in a position at least partially overlapping the deformation detection unit 3 or a position adjacent to the deformation detection unit 3. In such a case, a control unit 23 of the information terminal 10 preferably does not react to deformation of the deformation detection unit 3 that is not intended by the operator, but rather is based on whether or not the touch sensor has detected a touched state. This enables more accurate detection of the operator having pushed the belt portions 13, 14

Figure 5A:
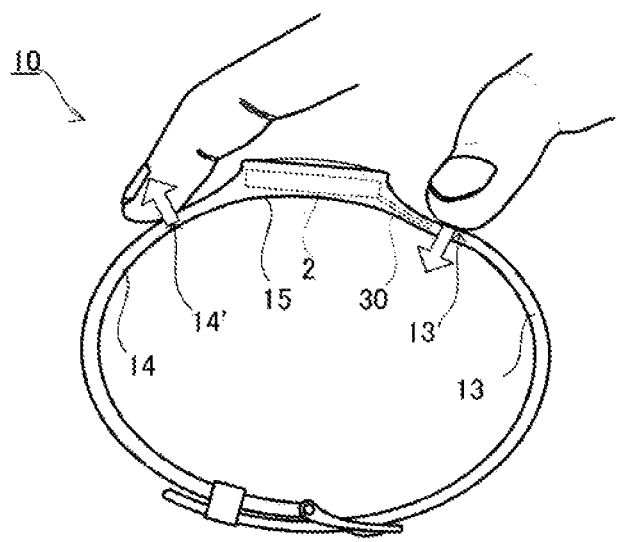
FIGS. 5(A) to 5(C) are schematic views showing a form of deformation by operation of the operation input device according to the first embodiment of the present invention.
Figure 5B:
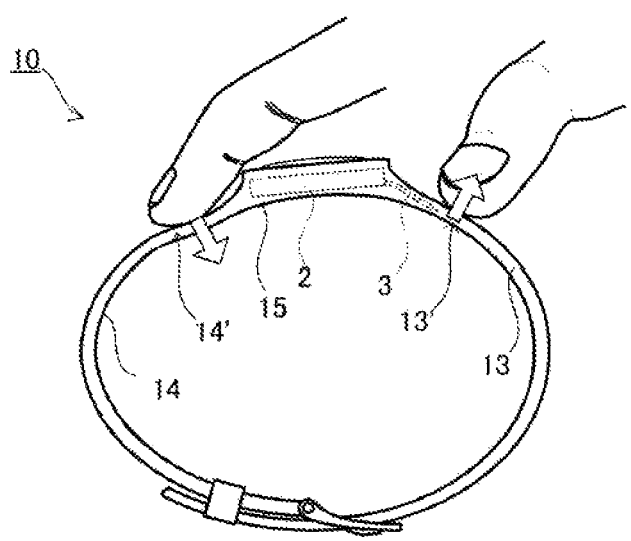
Figure 5C:
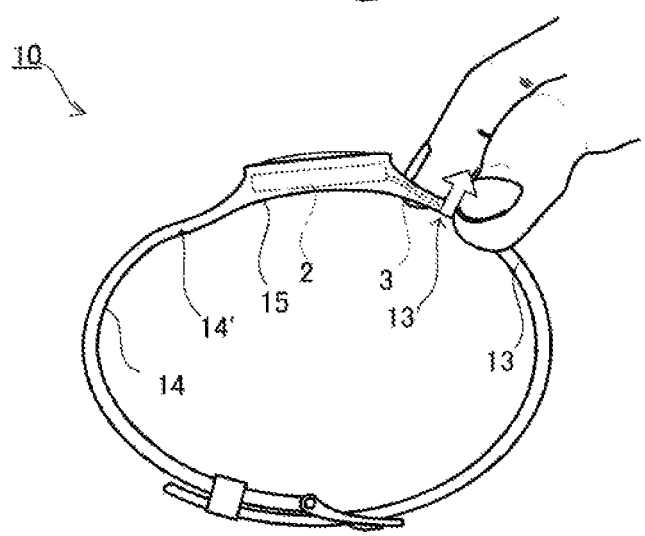

FIGS. 5(A) to 5(C) are side views of the information terminal 10 illustrating a form of deformation by operation of the information terminal 10.

With the information terminal 10 mounted on his or her wrist, the operator puts his or her finger on each or one of parts (first part 13' and second part 14') of the first belt portion 13 and the second belt portion 14 which are adjacent to the case portion 15, to operate the information terminal 10.

For example, as shown in FIG. 5(A), with the information terminal 10 mounted on the wrist, the operator puts the finger on the first part 13' of the first belt portion 13 which is adjacent to the case portion 15 to push down the first part 13' onto the wrist end. Then, in the first part 13', bending deformation occurring due to the mounting on the wrist is reduced, or the direction of the bending deformation is reversed. Accordingly, in the deformation detection unit 3 attached to the first part 13', the amount of distortion due to the bending deformation decreases or the positive and negative of the distortion amount are reversed. With this change in distortion amount, a charge is generated in each of the piezoelectric films 33, 34, and a detection signal is outputted from the deformation detection unit 3.

As shown in FIG. 5(B), with the information terminal 10 mounted on the wrist, the operator puts the finger on the second part 14' of the second belt portion 14 which is adjacent to the case portion 15 to push down the second part 14' onto the wrist end. In the second part 14', bending deformation occurring due to the mounting on the wrist is reduced, or the direction of the bending deformation is reversed. Then, in the rigid case portion 15 connected to this second part 14', inclination occurs such that the second part 14' end sinks into the wrist and the first part 13' end lifts up from the wrist. This leads to occurrence of larger bending deformation in the first part 13' that is connected to the case portion 15 on the opposite end from the second part 14'. The amount of distortion due to the bending deformation thus increases in the deformation detection unit 3 attached to the first part 13'. With this change in distortion amount, a charge is generated in each of the piezoelectric films 33, 34, and a detection signal where the polarity of the potential difference from the reference potential is opposite to that in the case of FIG. 5(A) is outputted from the deformation detection unit 3.

As shown in FIG. 5(C), with the information terminal 10 mounted on the wrist, the operator holds both side faces of the first part 13' in the first belt portion 13 between his or her fingers to separate the first part 13' from the wrist. This leads to an increase in amount of distortion due to bending deformation in the deformation detection unit 3 attached to the first part 13'. With this change in distortion amount, a charge is generated in each of the piezoelectric films 33, 34, and a detection signal where the polarity of the potential difference from the reference potential is opposite to that in the case of FIG. 5(A) and the same as that in the case of FIG. 5(B) is outputted from the deformation detection unit 3.

Therefore, in the foregoing control unit 23, it is possible to switch input processing in accordance with an acting direction of the external force, an acting position of the external force, an acting speed of the external force, or the like based on the polarity of the potential difference from the reference potential in the detection signal outputted by the deformation detection unit 3, a magnitude of the potential difference, a detection situation of the touch sensor in the case of providing the touch sensor, or the like, thereby accurately executing the input processing based on intended operation by the operator.

For example, when the information terminal 10 is a clock or the like having a display panel, it is possible to allocate respectively different button functions to such operation (click operation) as to push the first belt portion 13 or the second belt portion 14 once in a relatively short time, and such operation (double click operation) as to successively push the first belt portion 13 or the second belt portion 14 a plurality of times in a relatively short time. As the button functions, for example, it is possible to allocate a screen switching button function of switching a display screen of the display panel to another display screen, an icon switching button function of switching selection of an icon on the display screen, a decision button function of deciding execution of a function corresponding to a selected icon, a cancel button function of canceling a decision made by the decision button, and some other button function.

A different function can also be allocated to operation of long pushing each of the first belt portion 13 and the second belt portion 14 for a relatively long time. For example, a function of scrolling the screen displayed by the display panel can be allocated to the long pushing operation of the first belt portion 13 or the second belt portion 14 to associate the long pushing time with the scrolling amount, while the scrolling directions of the first belt portion 13 and the second belt portion 14 can be made different.

Further, the scrolling speed of the display screen and the like are associated with a speed (operation speed) at which the first belt portion 13 and the second belt portion 14 are pushed, to allow the control unit 23 to perform input and display control such that the scrolling speed of the display screen or the like is made adjustable in accordance with the operation speed.

As thus described, in the control unit 23 of the information terminal 10, a variety of operation on the band portion 11 can be associated to a variety of controls, and the operator can comfortably operate the information terminal 10 without a feeling of strangeness, thereby enhancing the convenience for the operator. Note that the variety of controls in the information terminal 10 described above are just illustrative, and the present invention also includes other controls and ways of use obtained by applying the present invention or putting it in practical use.

Next, a specific example of setting a dimension of the deformation detection unit 3 will be described.

Figure 6A:
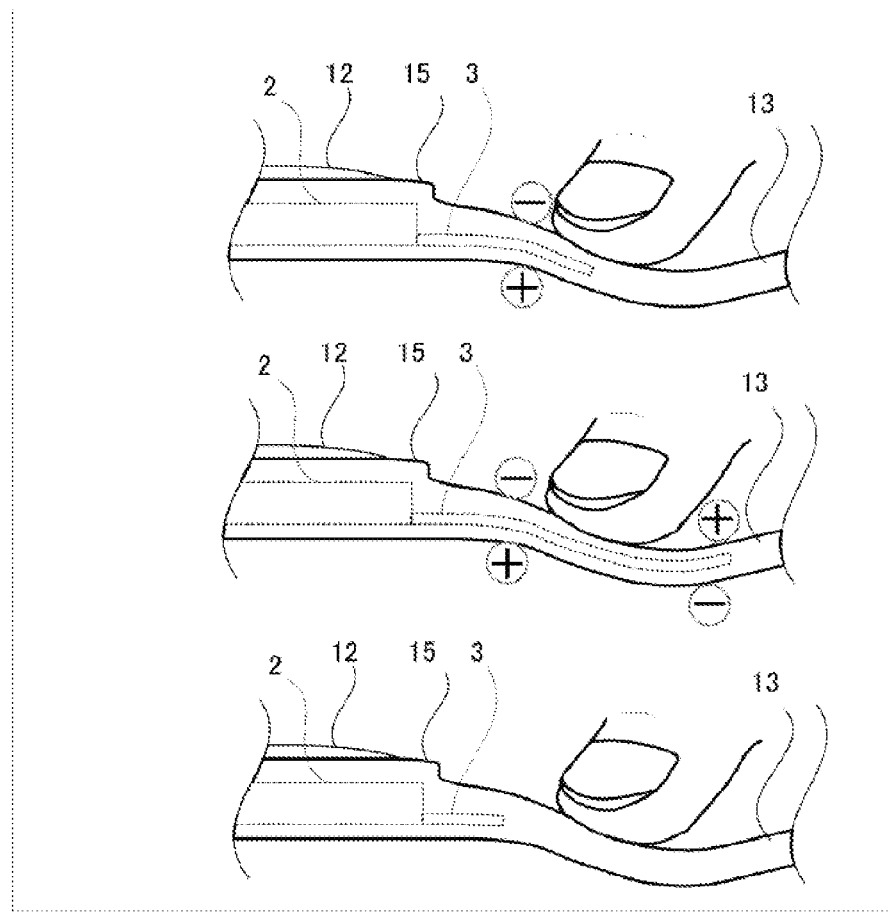
FIGS. 6(A) and 6(B) are a view and a graph for describing a corresponding relation between a length and detection sensitivity of the deformation detection unit included in the operation input device according to the first embodiment of the present invention.

In the deformation detection unit 3, the accuracy in detection of pressing operation on the band portion by the operator greatly depends on its longitudinal dimension (a dimension in the extending direction of the band portion). FIG. 6(A) is a schematic view for describing a distribution of a charge generated in the deformation detection unit 3 for each longitudinal dimension of the deformation detection unit 3.

An upper stage part of FIG. 6(A) shows a case where the longitudinal dimension of the deformation detection unit 3 is appropriate. When the longitudinal dimension of the deformation detection unit 3 is appropriate, bending stress acts in the same direction on any longitudinal position of the deformation detection unit 3, and a charge generated in the deformation detection unit 3 has the same electrical polarity at any longitudinal position.

Meanwhile, a middle stage part of FIG. 6(A) shows a case where the longitudinal dimension of the deformation detection unit 3 is large beyond an appropriate range. When the longitudinal dimension of the deformation detection unit 3 is excessively large, the acting direction of bending stress is reversed in the deformation detection unit 3 between a position closer to the case portion 15 than a point of action of an external force and a position opposite of the point of action of the external force from the case portion 15. Thus, charges with different electrical polarities generated in the deformation detection unit 3 cancel each other, undesirably causing deterioration in a signal to noise (SN) ratio in the detection signal outputted from the deformation detection unit 3.

A lower stage part of FIG. 6(A) shows a case where the longitudinal dimension of the deformation detection unit 3 is small beyond an appropriate range. When the longitudinal dimension of the deformation detection unit 3 is excessively small, the point of action of the external force is greatly apart from the deformation detection unit 3, and deformation hardly occurs in the deformation detection unit 3. This also undesirably causes deterioration in an SN ratio in the detection signal outputted from the deformation detection unit 3.

Figure 6B:
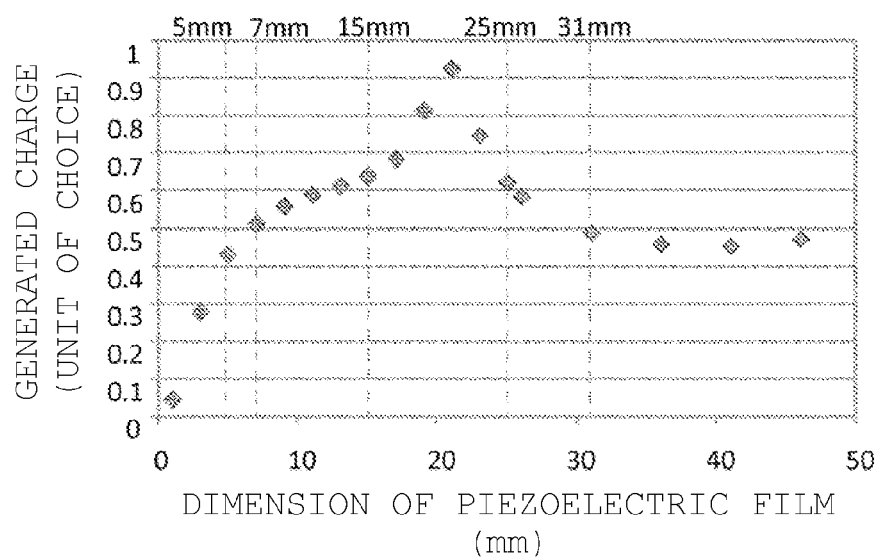

FIG. 6(B) is a graph showing the relation between a charge generated from the deformation detection unit 3, confirmed by a model test of the deformation detection unit 3, and the longitudinal dimension of the deformation detection unit 3. In the model test, the piezoelectric film was provided on one main face of a cantilevered base member while being apart from a fixed edge of the base member by 1 mm, and a face load was applied in a range of 1 mm to 21 mm from the fixed edge of the base member.

It was confirmed from the result of the test that, when the longitudinal dimension of the deformation detection unit 3 is smaller than 5 mm, the generated charge of the piezoelectric film is extremely small, and when the longitudinal dimension of the deformation detection unit 3 is larger than 5 mm, the generated charge of the piezoelectric film is not smaller than a certain level. This is considered because, as shown in the lower stage part of FIG. 6(A), the point of action of the external force is greatly apart from the piezoelectric film and little deformation is thus generated in the piezoelectric film.

It was also confirmed that, when the longitudinal dimension of the piezoelectric film is larger than 31 mm, the generated charge of the piezoelectric film is constant in a relatively small state. This is considered because, as shown in the middle stage part of FIG. 6(A), both positive and negative charges were generated in the piezoelectric film and those charges canceled each other.

It was also confirmed that, when the longitudinal dimension of the piezoelectric film is not smaller than 7 mm and smaller than 31 mm, the generated charge of the piezoelectric film is larger than in the case of the dimension being larger than 31 mm. This is considered because charges do not cancel each other so much in the piezoelectric film and deformation of the piezoelectric film has appropriately occurred.

It was further confirmed that, when the longitudinal dimension of the piezoelectric film is not smaller than 15 mm and smaller than 25 mm, the generated charge of the piezoelectric film becomes especially large. This is considered because, as shown in the upper stage part of FIG. 6(A), appropriate deformation has occurred in the piezoelectric film.

It is thus found that the longitudinal dimension of the deformation detection unit 3 has an appropriate range, and the longitudinal dimension of the deformation detection unit 3 is desirably larger than 5 mm. It is further found that the longitudinal dimension of the deformation detection unit 3 is desirably not smaller than 7 mm and not larger than 31 mm. It is found that in particular, the longitudinal dimension of the deformation detection unit 3 is almost optimal when it is not smaller than 15 mm and not larger than 25 mm.

As described above, according to the information terminal 10 of the present embodiment, the operation of the exterior portion 1 associated with deformation of the first belt portion 13 is detected, and hence the operator can perform operation of the information terminal 10 by instinctively (haptically) touching the exterior portion 1 to apply an external force thereto even without visually confirming the exterior portion 1.

Although the example of using the piezoelectric films 33, 34 as the deformation detection unit 3 has been shown in the description of the present embodiment, the deformation detection unit 3 may be configured using a function film other than the piezoelectric film. For example, a charge transfer film, a resistance film, an electric film, or the like can be used. When a variety of forms of deformation are to be discriminated and detected or when the pyroelectricity is an issue, the piezoelectric film, especially the PLLA film, is preferably used as shown in the present embodiment although details thereof will be described later. As the piezoelectric film, other than the film made of the PLLA, a film made of polyvinylidene fluoride (PVDF), a composite film formed by laminating piezoelectric ceramics on a resin film, or some other film can also be used.

Next, a description will be given of the case of detecting a different form of deformation from bending deformation as an operation input device according to a second embodiment of the present invention.

An information terminal 10A according to the second embodiment includes a deformation detection unit 3A with a configuration different from that of the first embodiment.

Figure 7A:
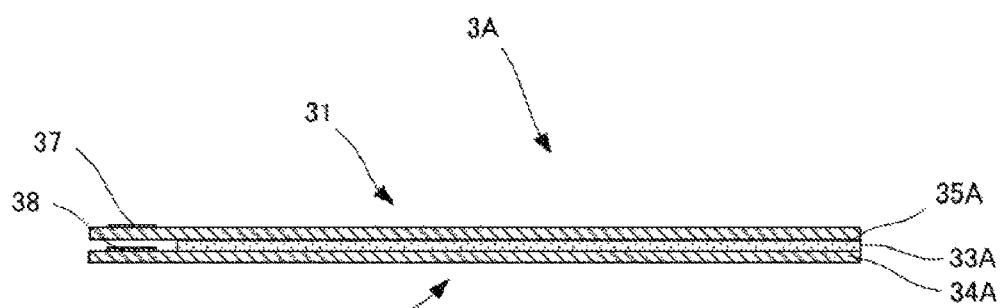
FIGS. 7(A) and 7(B) are a side view and a plan view of a deformation detection unit included in an operation input device according to a second embodiment of the present invention.
Figure 7B:
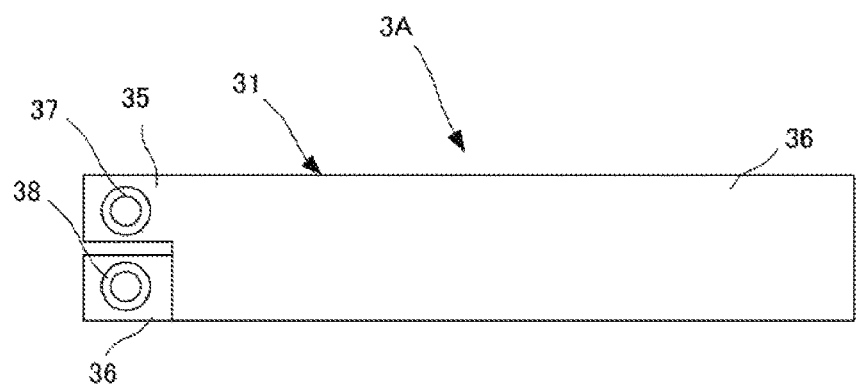

FIG. 7(A) is a side view of the deformation detection unit 3A, and FIG. 7(B) is a plan view of the deformation detection unit 3A.

The deformation detection unit 3a has a top face 31 and a bottom face 32 as laminated faces to be laminated with the first belt portion 13, and outputs a detection signal to the control unit 23 based on deformation of the top face 31 and the bottom face 32. In the present embodiment, the deformation detection unit 3A is configured so as to have the sensitivity to twisting deformation around an axis longitudinally along the top face 31 and the bottom face 32.

Specifically, the deformation detection unit 3 includes a piezoelectric film 33A, a signal electrode 34A, and a reference potential electrode 35A. The piezoelectric film 33A, the signal electrode 34A, and the reference potential electrode 35A are each in a belt shape having a longitudinal direction and a transverse direction in a plan view and being small thickness-wise, and are laminated and coupled with one another.

The signal electrode 34A is formed by stamping sheet-shaped copper foil with a thickness of about 10 µm into a predetermined shape. A longitudinal one edge end of the signal electrode 34A is configured as a connection portion 37 exposed thickness-wise, projecting from the edge faces of the piezoelectric film 33A and the reference potential electrode 35A.

The piezoelectric film 33A is made of polylactic acid (PLA), or more specifically, L-shaped polylactic acid (PLLA) subjected to a stretching processing, and is cut out such that the longitudinal direction on the film face forms an angle of 0° or 90° with respect to a main stretching direction. By being cut out as thus described, the piezoelectric film 33A has the sensitivity to twisting deformation around the axis longitudinally along the top face 31 and the bottom face 32. This piezoelectric film 33A is laminated on the top face 31-end signal electrode 34A.

The reference potential electrode 35A is laminated on the top face 31-end piezoelectric film 33A. A longitudinal one edge end of the reference potential electrode 35A is configured as a connection portion 38 exposed thickness-wise, projecting from the edge faces of the piezoelectric film 33A and the signal electrode 34A.

In the operation input device 10A using the deformation detection unit 3A with the configuration as thus described, the operator instinctively (haptically) touches the exterior portion 1 to apply an external force thereto even without visually confirming the exterior portion 1, and makes the first belt portion 13 subjected to twisting deformation rather than bending deformation or stretching deformation, so that the operator can operate the information terminal 10A in an easy and reliable manner.

Figure 8A:
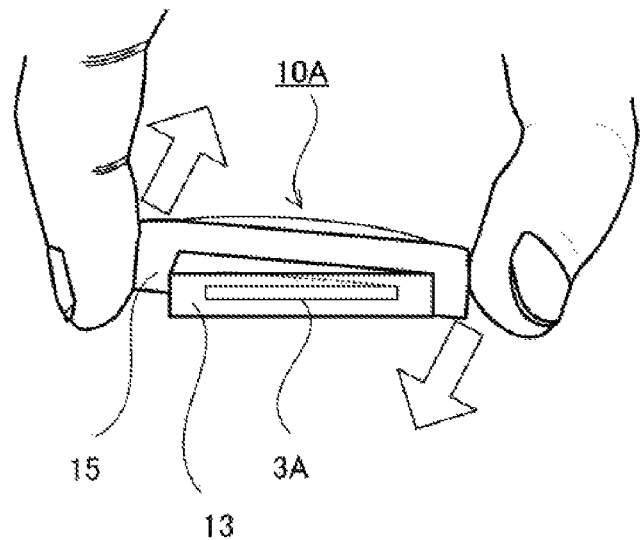
FIGS. 8(A) and 8(B) are schematic views showing a form of deformation by operation of the operation input device according to the second embodiment of the present invention.
Figure 8B:
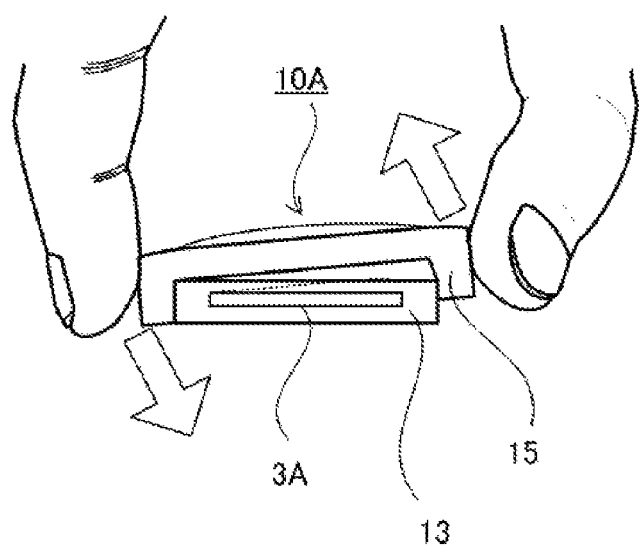

FIGS. 8(A) and 8(B) are side views of the information terminal 10A with the case portion 15 seen from the extending direction of the first belt portion 13, illustrating a form of deformation by operation of the information terminal 10A.

With the information terminal 10A mounted on the wrist, the operator holds both side faces of the case portion 15 or the first belt portion 13 between the fingers and raises the case portion 15 or the first belt portion 13 from its one side face end, to operate the information terminal 10A.

For example, as shown in FIG. 8(A), with the information terminal 10A mounted on the wrist, when the operator puts the fingers on both side faces of the case portion 15 and raises one side face end of the case portion 15, the deformation detection unit 3A attached to the first belt portion 13 is deformed so as to be twisted in a first rotating direction around the axis along the extending direction of the first belt portion 13. Alternatively, as shown in FIG. 8(B), with the information terminal 10A mounted on the wrist, when the operator puts the fingers on both side faces of the case portion 15 and raises the other side face end of the case portion 15, the deformation detection unit 3A is deformed so as to be twisted in a second rotating direction around the axis along the extending direction of the first belt portion 13.

Accordingly, in the deformation detection unit 3A, a charge is generated in the piezoelectric film 33A in association with the twisting deformation, and a detection signal is outputted. At this time, the polarity of the potential difference from the reference potential in the detection signal is reversed in accordance with the rotating direction of the twisting deformation.

Thus, in the foregoing control unit 23, the input processing is switched based on the polarity of the potential difference from the reference potential in the detection signal outputted by the deformation detection unit 3A, to allow execution of the input processing based on the kind of operation intended by the operator.

FIGS. 9(A) and 9(B) are front views of the information terminal 10 illustrating a form of deformation by operation.

With the information terminal 10 mounted on the wrist, the operator holds both side faces of the case portion 15 between the fingers and rotates the case portion 15, to operate the information terminal 10. However, the first belt portion 13 and the second belt portion 14 are fixed so as to prevent the case portion 15 from rotating.

For example, as shown in FIG. 9(A), with the information terminal 10 mounted on the wrist, the operator holds both side faces of the case portion 15 between the fingers and rotates the case portion 15 counterclockwise. Accordingly, the deformation detection unit 3 attached to the first belt portion 13 is deformed so as to be twisted in a first rotating direction around the axis along the extending direction of the first belt portion 13.

Further, as shown in FIG. 9(B), with the information terminal 10 mounted on the wrist, the operator holds both side faces of the case portion 15 between the fingers and rotates the case portion 15 clockwise. Accordingly, the deformation detection unit 3 attached to the first belt portion 13 is deformed so as to be twisted in a second rotating direction around the axis along the extending direction of the first belt portion 13.

Thus, in the deformation detection unit 3, a charge is generated in the piezoelectric film 33 in association with the twisting deformation, and a detection signal is outputted. At this time, the polarity of the potential difference from the reference potential in the detection signal is reversed in accordance with the rotating direction of the twisting deformation.

Hence the foregoing control unit 23 switches the input processing based on the polarity of the potential difference from the reference potential in the detection signal outputted by the deformation detection unit 3, and can thus execute the input processing based on the kind of operation intended by the operator.

Although the deformation detection unit 3 is disposed only in the first belt portion 13 in FIG. 9, this is not restrictive. In implementation, the deformation detection unit 3 may be disposed only in the second belt portion 14, or may be disposed in both the first belt portion 13 and the second belt portion 14 so as to hold the case portion 15 therebetween. When the deformation detection unit 3 is disposed in each of the first belt portion 13 and the second belt portion 14, the information terminal 10 can detect twisting more accurately.

Although the case of providing only one deformation detection unit has been illustrated in each of the above embodiments, the operation input device according to the present invention can be configured including a plurality of deformation detection units.

Next, a description will be given of the case of including a plurality of deformation detection units as an operation input device according to a third embodiment of the present invention.

Figure 10A:
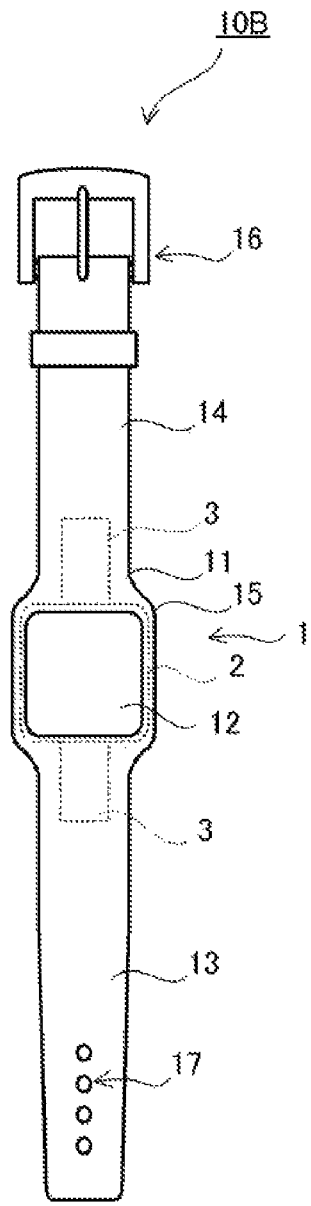
FIGS. 10(A) and 10(B) are a plan view and a side view of an operation input device according to a third embodiment of the present invention.
Figure 10B:
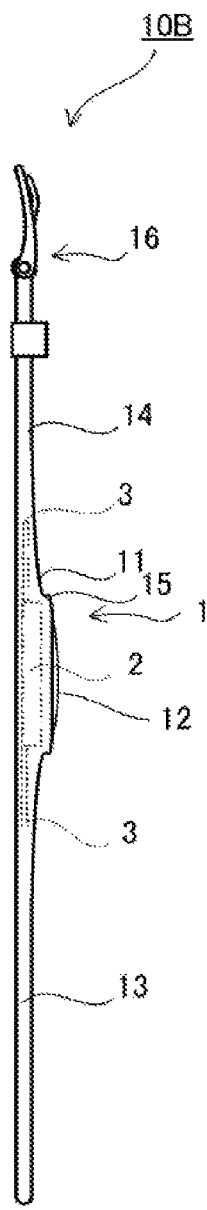

FIGS. 10(A) and 10(B) are a plan view and a side view of an information terminal 10B according to the third embodiment of the present invention.

An information terminal 10B according to the third embodiment includes the deformation detection unit 3 having the sensitivity to bending deformation in each of the first belt portion 13 and the second belt portion 14. The deformation detection unit 3 provided in the first belt portion 13 mainly detects bending deformation of the first belt portion 13, and the deformation detection unit 3 provided in the second belt portion 14 mainly detects bending deformation of the second belt portion 14. By disposing the plurality of deformation detection units 3 in the different positions as thus described, deformation can be detected more accurately in each of the deformation detection units 3. Further, in the first belt portion 13 and the second belt portion 14, the two deformation detection units 3 are disposed in linear symmetry with respect to the case portion 15. This can set the hardness, namely the pushing easiness, of each of the first belt portion 13 and the second belt portion 14 to almost the same degree.

Although the example has been shown in the present embodiment where the deformation detection unit 3 having the sensitivity to bending deformation is provided in each of the first belt portion 13 and the second belt portion 14, the deformation detection unit 3A having the sensitivity to twisting deformation may be provided in each of the first belt portion 13 and the second belt portion 14. Alternatively, the deformation detection unit 3 having the sensitivity to bending deformation may be provided in one of the first belt portion 13 and the second belt portion 14, and the deformation detection unit 3A having the sensitivity to twisting deformation may be provided in the other.

Next, a description will be given of the case of including a plurality of deformation detection units in a laminated manner as an operation input device according to a fourth embodiment of the present invention.

An operation input device according to the fourth embodiment includes a deformation detection unit 3C with a configuration different from that of each of the foregoing embodiments.

Figure 11A:
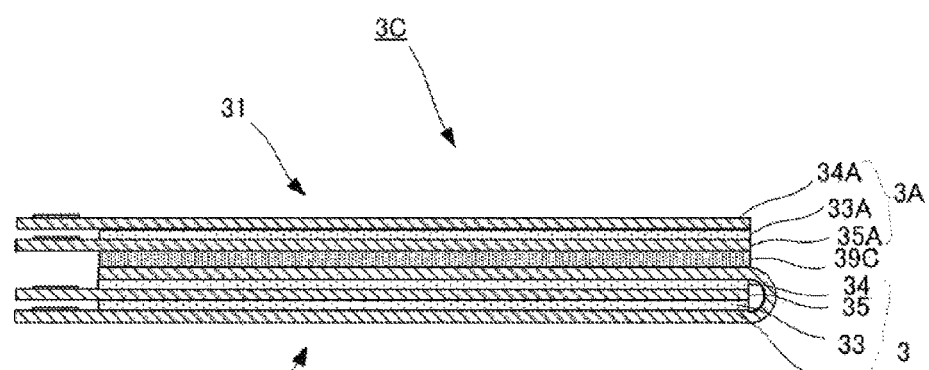
FIGS. 11(A) and 11(B) are a side view and a plan view of a deformation detection unit included in an operation input device according to a fourth embodiment of the present invention.
Figure 11B:
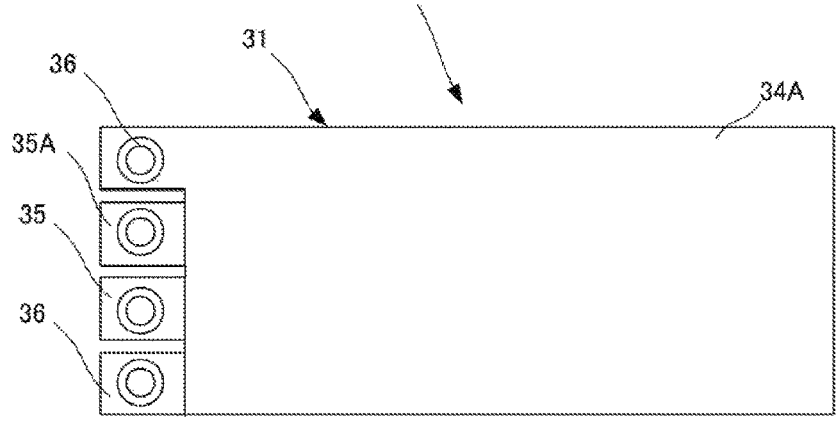

FIG. 11(A) is a side view of the deformation detection unit 3C, and FIG. 11(B) is a plan view of the deformation detection unit 3C.

The deformation detection unit 3C is formed by laminating the deformation detection unit 3 shown in the first embodiment and the deformation detection unit 3A shown in the second embodiment. That is, the deformation detection unit 3C has the top face 31 and the bottom face 32 as laminated faces to be laminated with the band portion 11, and outputs to the control unit 23 a detection signal based on bending deformation of the top face 31 and the bottom face 32 and a detection signal based on twisting deformation thereof.

Specifically, the deformation detection unit 3C includes the piezoelectric films 33, 34, the signal electrode 35, the reference potential electrode 36, the piezoelectric film 33A, the signal electrode 34A, the reference potential electrode 35A, and a paste member 39C for pasting between the deformation detection unit 3 and the deformation detection unit 3A.

In the operation input device using the deformation detection unit 3C configured as thus described, the operator instinctively (haptically) touches the exterior portion to apply an external force thereto even without visually confirming the exterior portion and makes the first belt portion and the laminated faces of the deformation detection unit 3C subjected to bending deformation or twisting deformation to cause the deformation detection unit 3C to output a detection signal, so that the operator can operate the information terminal in an easy and reliable manner.

Although the case has been illustrated in this embodiment where the deformation detection unit 3C is formed by separately constituting the deformation detection unit 3 for bending detection and the deformation detection unit 3A for twisting detection and pasting those portions on each other, it can also be configured such that the deformation detection unit 3 for bending detection and the deformation detection unit 3A for twisting detection share a reference potential electrode.

Although the case has been described in each of the above embodiments where the band portion 11 formed by integrally constituting the case portion 15, the first belt portion 13, and the second belt portion 14 is illustrated, the band portion according to the present invention can be formed with other configurations.

Next, a description will be given of the case of separately constituting the case portion and the band portion as an operation input device according to a fifth embodiment of the present invention.

Figure 12A:
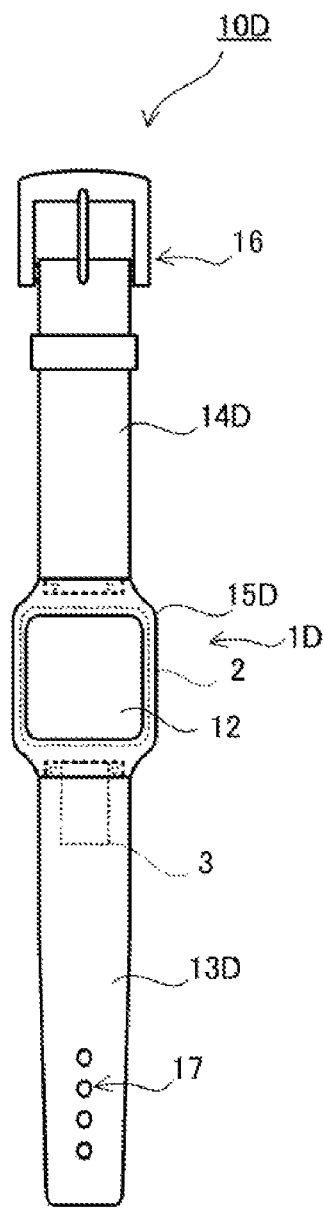
FIGS. 12(A) and 12(B) are a plan view and a side view of an operation input device according to a fifth embodiment of the present invention.
Figure 12B:
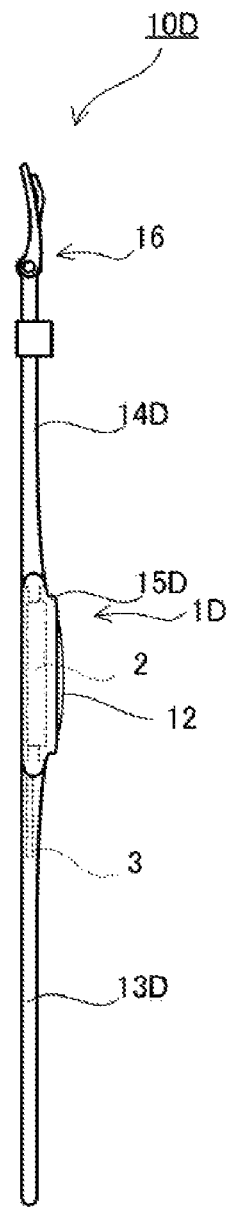

FIGS. 12(A) and 12(B) are a plan view and a side view of an information terminal 10D according to the fifth embodiment of the present invention.

The information terminal 10D includes an exterior portion 1D, the electric module unit 2, and the deformation detection unit 3. The exterior portion 1D includes a first belt portion 13D, a second belt portion 14D, a case portion 15D, and a glass portion 12. Here, each of the first belt portion 13D and the second belt portion 14D is configured corresponding to the band portion recited in the claims. The first belt portion 13D and the second belt portion 14D are each made of a resin member having elasticity, such as silicone rubber. The case portion 15D is made of a resin different from and more rigid than the first belt portion 13D and the second belt portion 14D, and the case portion 15D is also referred to as the body portion.

Figure 13:
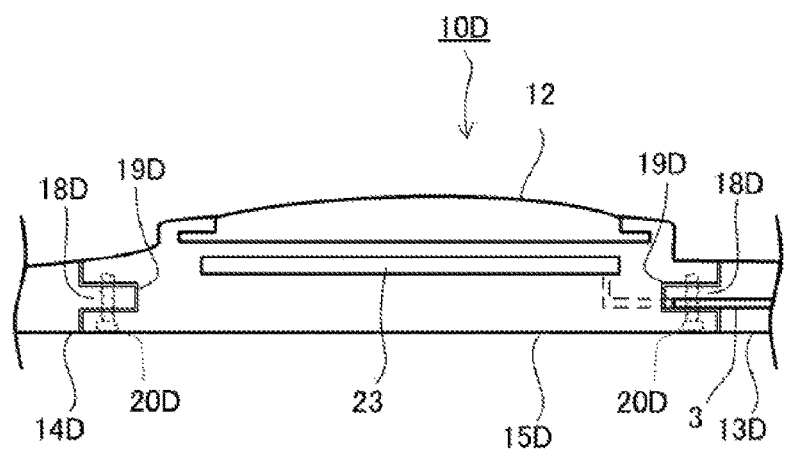
FIG. 13 is a side sectional view of the operation input device according to the fifth embodiment of the present invention.

FIG. 13 is a schematic view showing a structure of connection between the case portion 15D and each of the belt portions 13D, 14D. A projection 18D projecting to the case portion 15D end in a thickness-wise center part is formed at the connection edge of each of the belt portions 13D, 14D with the case portion 15D. The projection 18D is configured in the shape of a connector where the connection portion of the deformation detection unit 3 is exposed to the surface. The connection edge of one case portion 15D with each of the belt portions 13D, 14D is formed with a depression 19D in the thickness-wise center part. The depression 19D is configured in the shape of a connector where the electrode connected to the control unit 23 through a wire is exposed to the surface. The shapes of the projection 18D and the depression 19D are configured to have roughly the same shapes and roughly match, and configured such that the projection 18D is fitted into the depression 19D. Further, it is preferable that the connection edge of the case portion 15D and each of the belt portions 13D, 14D be formed with a through hole or a screw hole, not shown, and the belt portion 13D and the case portion 15D be rigidly coupled with each other by a screw 20D or the like.

With such a connection structure formed, even when the first belt portion 13D, the second belt portion 14D, and the case portion 15D are configured separately, the deformation detection unit 3 attached to the first belt portion 13D can be wired and connected to the control unit 23 provided in the case portion 15D.

Next, a description will be given of the case of providing the deformation detection unit 3 on the side face of the housing 24 as an operation input device according to a sixth embodiment of the present invention.

Figure 14A:
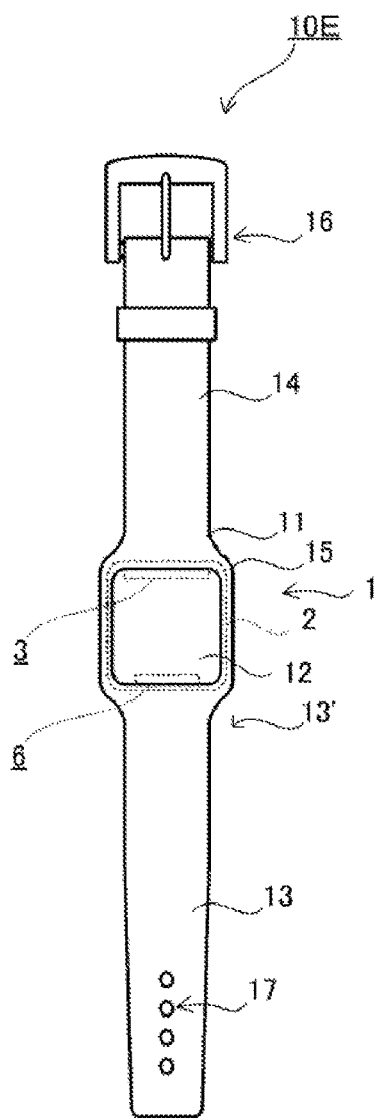
FIGS. 14(A) and 14(B) are a front view and a side sectional view of an operation input device according to a sixth embodiment of the present invention.
Figure 14B:
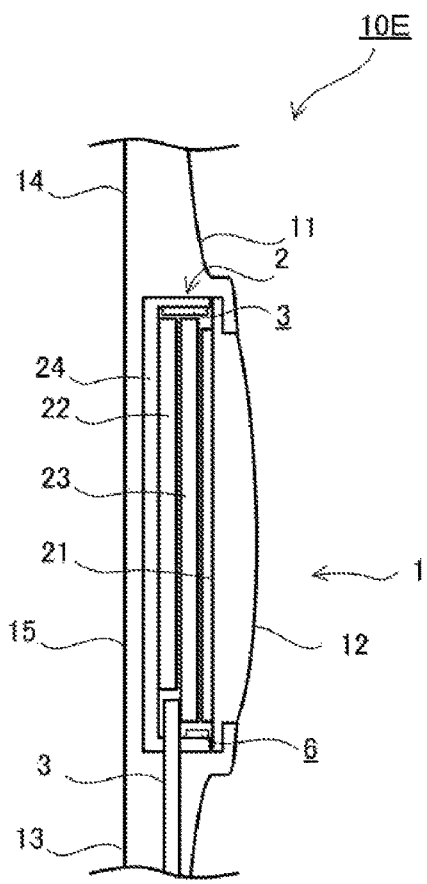

FIGS. 14(A) and 14(B) are a front view and a side sectional view of an information terminal 10E according to the sixth embodiment of the present invention. The information terminal 10E is different from the information terminal 10 in that the deformation detection unit 3 and an acceleration sensor 6 are provided on the side faces of the housing 24. Since the other respects are the same, the description thereof is omitted.

With this configuration, with the information terminal 10 mounted on the wrist, the operator holds both side faces of the case portion 15 between the fingers to press the housing

24. The deformation detection unit 3 attached to the housing 24 is thereby deformed so as to be twisted.

Thus, in the deformation detection unit 3, a charge is generated in the piezoelectric film 33 in association with the twisting deformation, and a detection signal is outputted. At this time, the polarity of the potential difference from the reference potential in the detection signal is reversed in accordance with the rotating direction of the twisting deformation.

Hence the foregoing control unit 23 switches the input processing based on the polarity of the potential difference from the reference potential in the detection signal outputted by the deformation detection unit 3, and can thus execute the input processing based on the kind of operation intended by the operator. Since not needing to press a specific position such as a switch, the operator can easily perform operation even during running, for example. The information terminal 10E is thus excellent in operability.

When the information terminal 10E is mounted on the wrist or the like of the operator, for example, operation is easily performed on the side face of the housing 24 as compared with the bottom face of the housing 24. The deformation detection unit 3 is thus provided on the side face of the housing 24 to enable improvement in the operator's operability in the information terminal 10E.

Here, the deformation detection unit 3 has the possibility to bring about malfunction due to an unintended shake of the band portion 11. Examples of the unintended shake of the band portion 11 include a swing of his or her arm at the time when the operator walks wearing the watch, and vibration at the time when the operator walks holding a bag with the watch therein.

The information terminal 10E then includes the acceleration sensor 6 on the side face of the housing 24 and uses it together with the deformation detection unit 3. Accordingly, the information terminal 10E can detect whether or not the operator has applied a pressing force based on output of the acceleration sensor 6 and output of the deformation detection unit 3.

Although the deformation detection unit 3 is provided on the side face of the housing 24 in FIG. 14, this is not restrictive. In implementation, the deformation detection unit 3 may be provided on the bottom face of the housing 24, for example. Further, the deformation detection unit 3 may be provided in each of at least two places among the housing 24, the first belt portion 13, and the second belt portion 14, for example. Providing the deformation detection unit 3 in each of at least two places as thus described allows the information terminal 10 to detect twisting more accurately.

Similarly, the acceleration sensor 6 is disposed on the side face of the housing 24 in FIG. 14, but this is not restrictive. In implementation, the acceleration sensor 6 may be provided on the bottom face of the housing 24, for example. Further, the acceleration sensor 6 may be provided in each of at least two places among the housing 24, the first belt portion 13, and the second belt portion 14, for example. Providing the acceleration sensor 6 in each of at least two places as thus described allows the information terminal 10 to detect acceleration more accurately. Although the information terminal 10E includes acceleration sensor 6, this is not restrictive. In implementation, the other information terminals 10 and 10A to 10D can also include the acceleration sensor 6.

Next, a description will be given of a first example of a control flow applicable to the operation input device shown in each of the foregoing embodiments.

Figure 15:
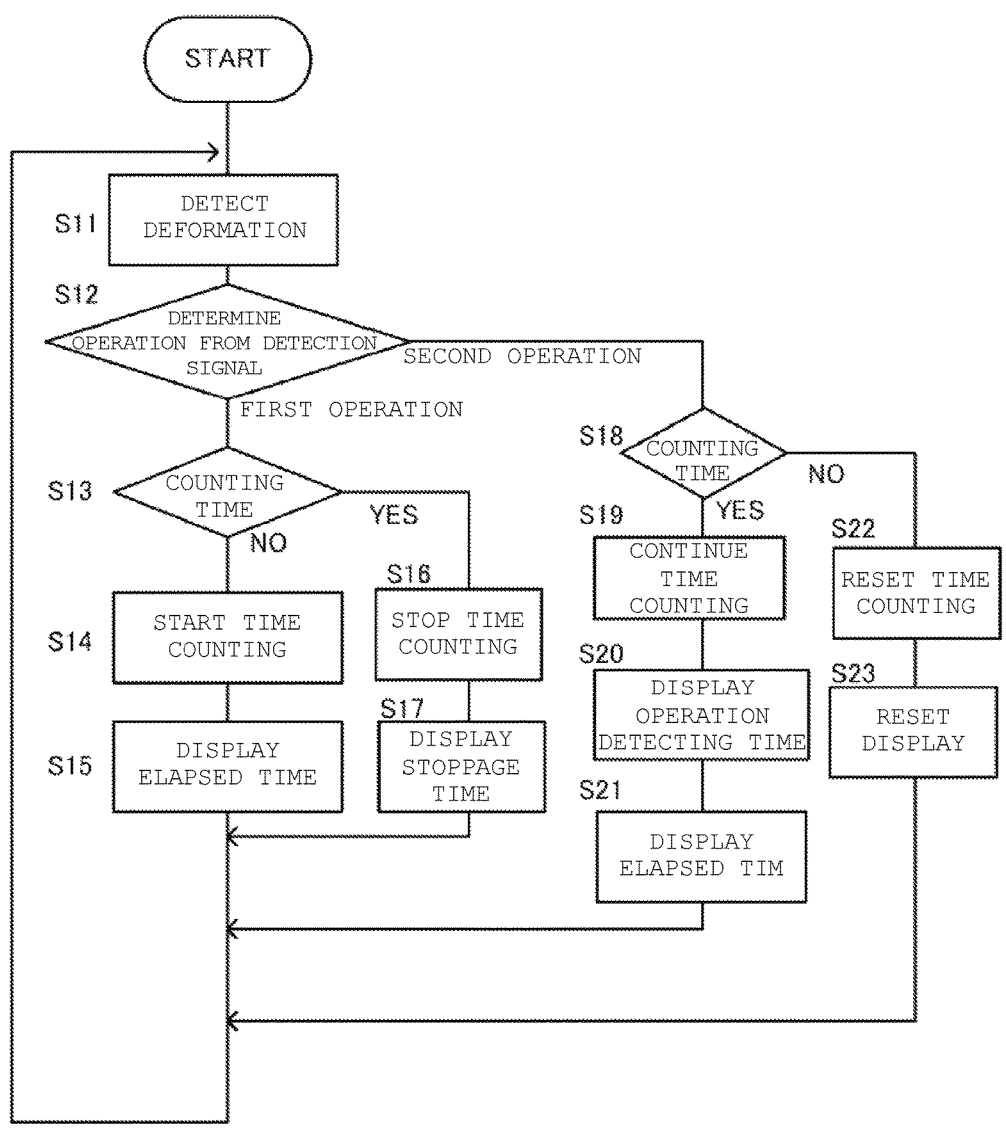
FIG. 15 is a diagram showing a control flow in a first example of the operation input device according to the present invention.
Figure 16:
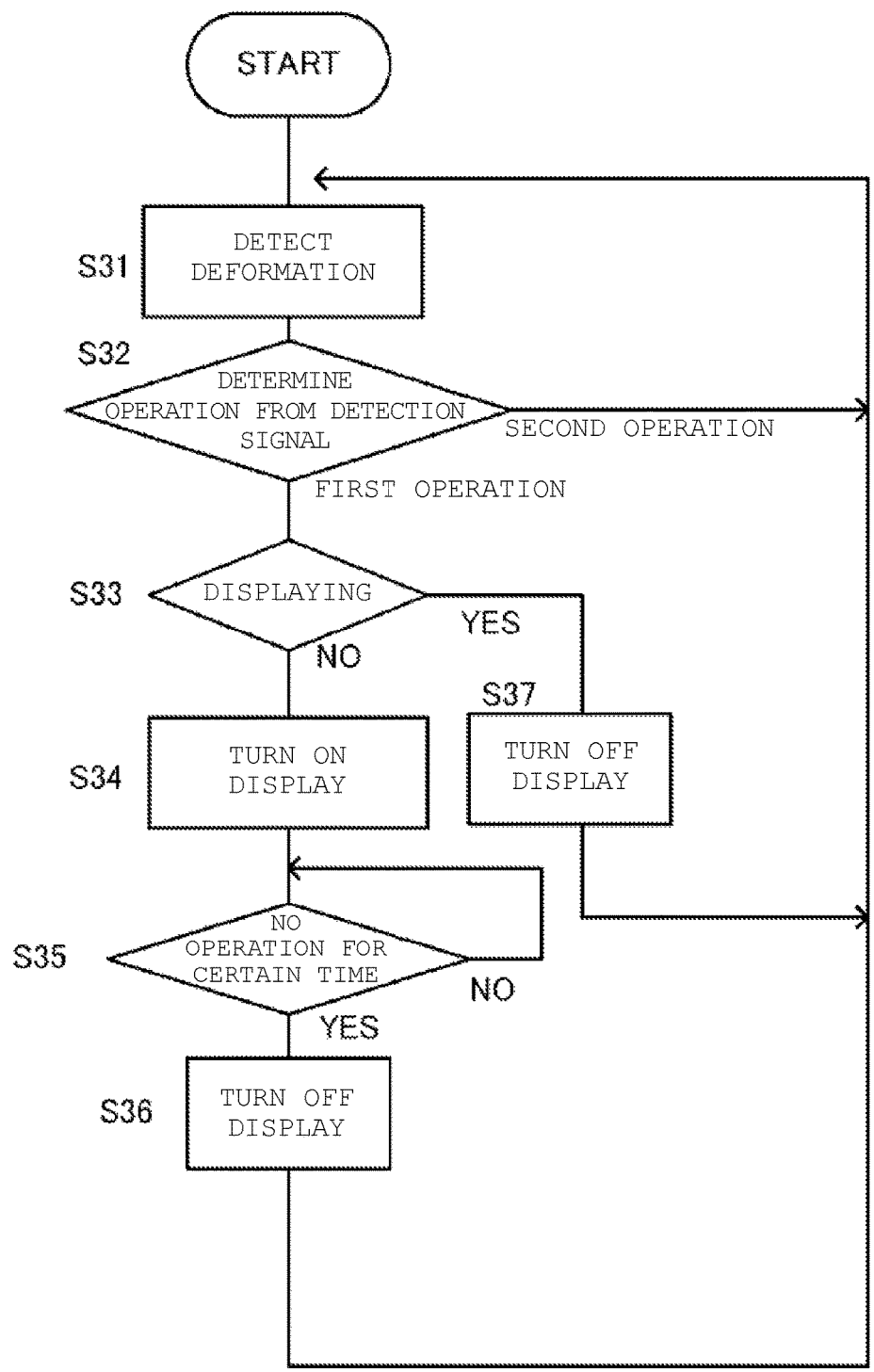
FIG. 16 is a diagram showing a control flow in a second example of the operation input device according to the present invention.

FIG. 15 is a control flow in the case of providing the operation input device with a stopwatch function.

In the operation input device having been started in a stopwatch mode, when a predetermined external force is applied on the exterior portion and deformation occurs in the band portion and the deformation detection unit, a detection signal from the deformation detection unit is inputted into the control unit (S11).

Then, the control unit determines the type of operation performed by the operator based on the polarity of the potential difference from the reference potential in the detection signal and the relation between the magnitude (operation speed) of the potential difference and the appropriate threshold (S12). For example, the control unit determines the type of operation as to whether it is operation of pressing the first belt portion, operation of pressing the second band portion (operation of separating the first belt portion), operation of twisting the case portion from the left side face end, operation of twisting the case portion from the right side face end, or some other operation.

When determining that a first operation (e.g., pressing of the first belt portion) has been performed, the control unit determines whether or not the current state is a time counting state (S13). When the current state is not the time counting state, the control unit starts the time counting (S14) Further, the control unit displays on the display the elapsed time being counted (S15).

When determining that the first operation has been performed and the current state is the time counting state, the control unit temporarily stops the time counting (S16). Further, the control unit displays on the display the elapsed time till the stoppage time when the time counting is stopped (S17)

When determining that second operation (e.g., pressing of the second band portion) has been performed, the control unit determines whether or not the current state is the time counting state (S18). When the current state is the time counting state, the control unit continues the time counting (S19). Further, the control unit displays on the display the elapsed time till the operation detecting time when the second operation is detected (S20). After the lapse of a certain time, the control unit displays the elapsed time being counted on the display again (S21).

When determining that the second operation has been performed and the current state is not the time counting state, the control unit resets the time counting (S22). Further, the control unit resets the display on the display (S23).

As described above, the operation input device according to the first example of the present invention can be provided with the stopwatch function.

Next, a description will be given of a second example of the control flow applicable to the operation input device shown in each of the foregoing embodiments.

In the case of the operation input device including the display unit, when the power supply of the display unit is regularly on, a power supply voltage is consumed in a short time. Then, detecting appropriate operation by the user and switching between a display-on state and a display-off state makes it possible to hold the power consumption low while improving the convenience for the user. However, when the appropriate operation by the user is detected using the acceleration sensor, the touch panel, or the like, erroneous switching between the display-on state and the display-off state may occur due to unintended operation by the user. Accordingly, in the second example of the control flow described below, the operation input device is caused to switch between the display-on state and the display-off state in accordance with deformation of the band portion, thereby preventing occurrence of erroneous switching between the display-on state and the display-off state due to unintended operation by the user.

FIG. 15 is a control flow in the case of providing the operation input device with a switching function between the display-on state and the display-off state.

In the operation input device having been started in a switching mode between the display-on state and the display-off state, when a predetermined external force is applied to the exterior portion and deformation occurs in the band portion and the deformation detection unit, a detection signal from the deformation detection unit is inputted into the control unit (S31).

Then, the control unit determines the type of operation the operator has performed based on the polarity of the potential difference from the reference potential in the detection signal and the relation between the magnitude (operation speed) of the potential difference and the appropriate threshold (S32). When determining that a second operation (e.g., pressing of the second band portion) has been performed, the control unit does not change the current state or performs operation in another kind of operation mode. Meanwhile, when determining that the first operation (e.g., pressing of the first belt portion) has been performed, the control unit determines whether or not the current state is a displaying state (S33) When the current state is not the displaying state, the control unit turns on the display unit (S34). The control unit then determines whether or not the other operation is obtained for a certain time (S35). When not obtaining the other operation, the control unit turns off the display again (S36).

When determining that the first operation has been performed and the current state is the displaying state, the control unit turns off the display (S37).

As described above, the operation input device according to the second example of the present invention can be provided with the switching function between the display-on state and the display-off state.

Next, a description will be given of a third example of the control flow applicable to the operation input device shown in each of the foregoing embodiments.

Figure 17:
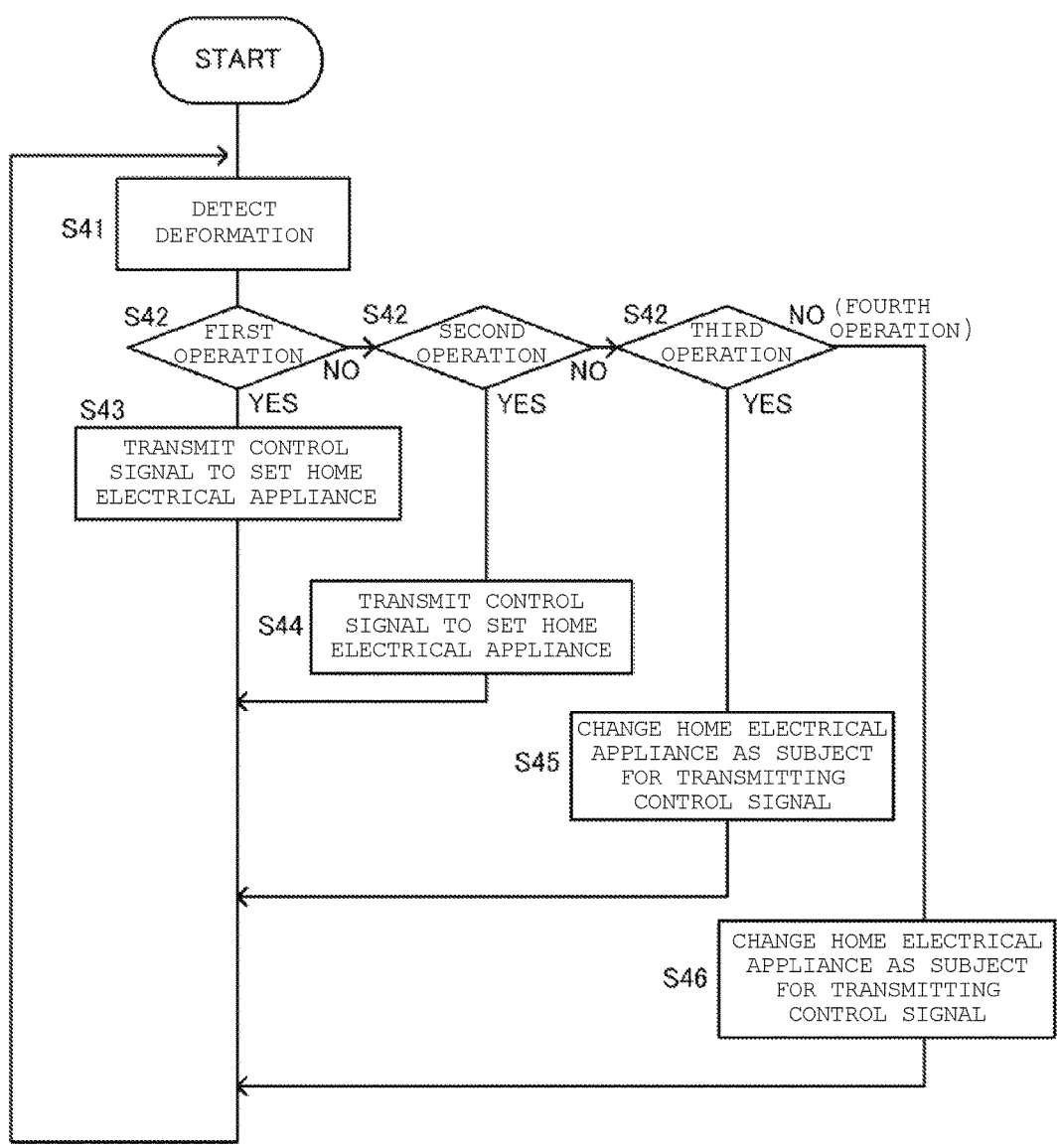
FIG. 17 is a diagram showing a control flow in a third example of the operation input device according to the present invention.

FIG. 17 is a control flow in the case of providing the operation input device with a function of controlling a home electrical appliance or the like (a remote control function).

In the operation input device having been started in a remote control mode, when a predetermined external force is applied to the exterior portion and deformation occurs in the band portion and the deformation detection unit, a detection signal from the deformation detection unit is inputted into the control unit (S41).

Then, the control unit determines the type of operation the operator has performed based on the polarity of the potential difference from the reference potential in the detection signal and the relation between the magnitude (operation speed) of the potential difference and the appropriate threshold (S42).

When the control unit determines that the first operation (e.g., pressing of the first belt portion) has been performed, among currently set control signals with respect to the home electrical appliance, the control unit transmits a control signal (e.g., a television channel change signal, etc.) corresponding to the operation by using predetermined wireless transmission means (S43). The predetermined wireless transmission means is infrared transmission, BLUETOOTH (registered trademark) transmission, Wi-Fi transmission, and the like. Hence the operation input device includes a communication unit (infrared light emitting unit, BLUETOOTH (registered trademark) communication antenna, Wi-Fi transmission antenna, etc.) for achieving those wireless transmission means.

When the control unit determines that the second operation (e.g., pressing of the second band portion) has been performed, among currently set control signals with respect to the home electrical appliance, the control unit transmits a control signal corresponding to the operation by using predetermined wireless transmission means (S44). At the time of executing these steps (S41 to S44), it is preferable to previously display the corresponding relation between the operation type and the transmission signal on the display unit provided in the operation input device.

When determining that a third operation (e.g. raising of the case portion from its left side face end) has been performed, the control unit performs setting to change (rotate) the home electrical appliance as a target for transmitting a control signal to another home electrical appliance (S45). Similarly, when determining that a fourth operation (e.g. raising of the case portion from its right side face end) has been performed, the control unit performs setting to change (rotate) the home electrical appliance as a target for transmitting a control signal to another home electrical appliance (S46). Note that the rotating order of the setting is preferably reversed between the third operation and the fourth operation. At the time of executing these steps (S41 to S46), it is preferable to previously display the corresponding relation between the operation type and the selected home electrical appliance on the display unit provided in the operation input device.

As described above, the operation input device according to the third example of the present invention can be provided with the remote control function.

Next, a description will be given of a fourth example of the control flow applicable to the operation input device shown in each of the foregoing embodiments.

Figure 18:
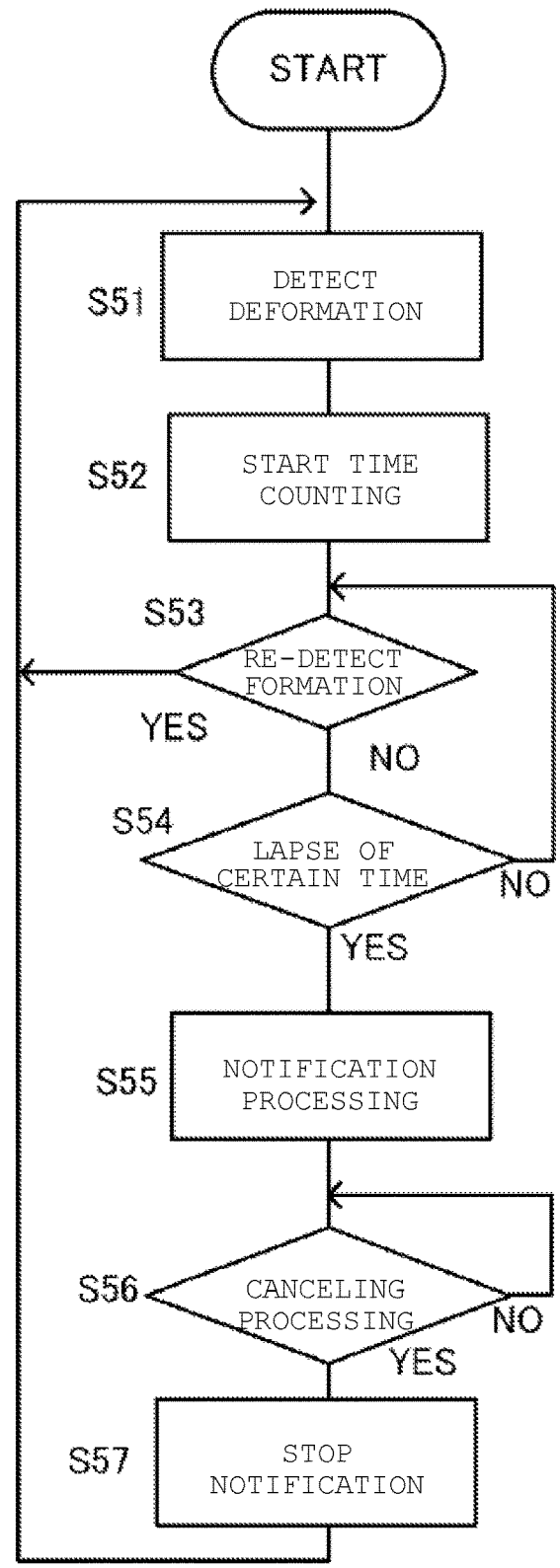
FIG. 18 is a diagram showing a control flow in a fourth example of the operation input device according to the present invention.

FIG. 18 is a control flow in the case of providing the operation input device with a notification function such as a nurse call or a burglar alarm.

In the operation input device having been started in a notification mode, when a predetermined external force is applied to the exterior portion and deformation occurs in the band portion and the detection portion, a detection signal from the deformation detection unit is inputted into the control unit (S51).

The control unit then starts the time counting (S52). The control unit then determines whether or not a detection signal from the deformation detection unit is detected again (S53), and waits for a certain time to pass (S54). When not detecting the detection signal from the deformation detection unit again even after the lapse of the certain time (e.g., 10 seconds), the control unit executes notification of the nurse call or burglar alarm by using predetermined means (S55). The notification using the predetermined means is communication to a registered address by the wireless transmission means (BLUETOOTH (registered trademark) communication antenna, Wi-Fi communication antenna, etc.), or activating an alarm by alarm activation means such as a notification sound unit.

When detecting the detection signal from the deformation detection unit again before the lapse of the certain time from the start of the time counting, the control unit cancels the notification and the time counting (S53).

When a predetermined canceling operation is performed after the notification processing (S56), the control unit stops the notification processing (S57).

As described above, the operation input device according to the fourth example of the present invention can be provided with the notification function. Even in a situation being emergent and having difficulty in operating the touch panel, the switch, or the like, such as the case of coming down with a sudden illness or the case of coming across a crime or an accident, this operation input device can perform a predetermined notification by such operation as to nip or tightly hold the band portion or the like of the operation input device. When the operation input device is erroneously operated, the operation can be canceled during a certain count-down period before notification.

Next, a description will be given of a fifth example of the control flow applicable to the operation input device shown in each of the foregoing embodiments.

Figure 19:
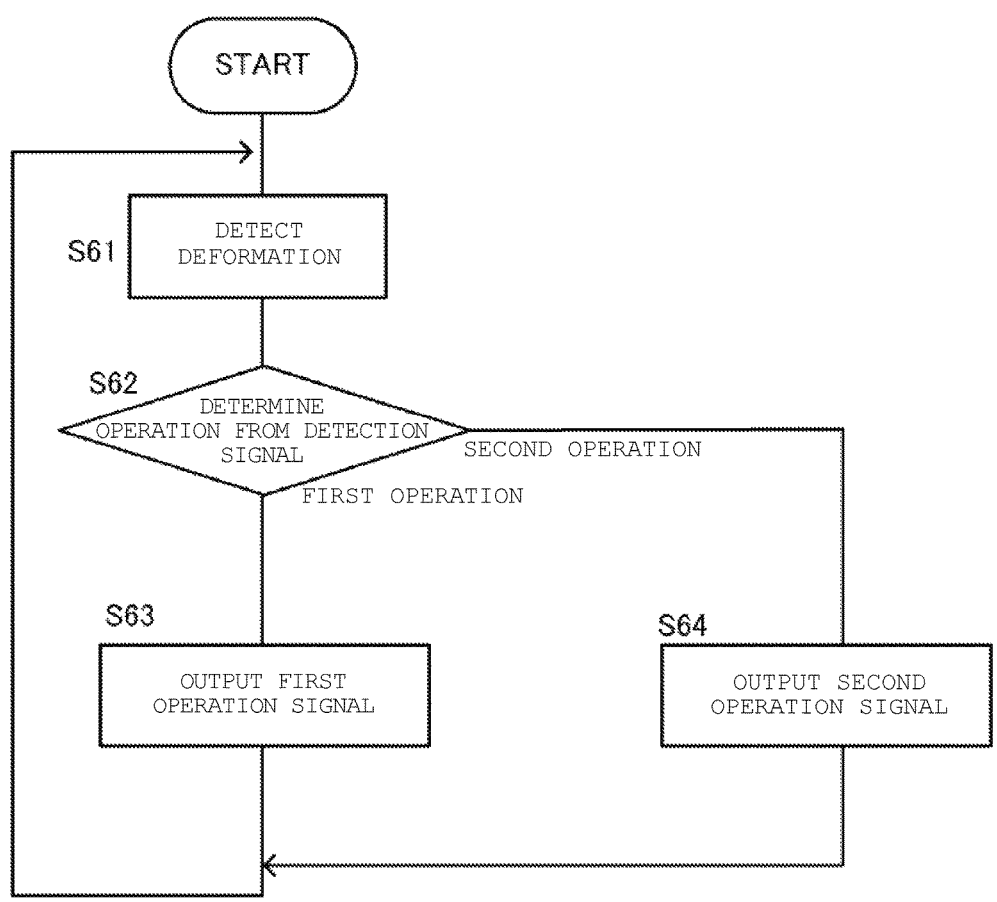
FIG. 19 is a diagram showing a control flow in a fifth example of the operation input device according to the present invention.

FIG. 19 is a control flow in the case of providing the operation input device with a graphical user interface (GUI) operation function.

In the operation input device having been started in a state where the GUI such as browser software is displayed on the display unit (GUI operation mode), when a predetermined external force is applied to the exterior portion and deformation occurs in the band portion and the deformation detection unit, a detection signal from the deformation detection unit is inputted into the control unit (S61).

Then, the control unit determines the type of operation the operator has performed based on the polarity of the potential difference from the reference potential in the detection signal and the relation between the magnitude (operation speed) of the potential difference and the appropriate threshold (S62). When determining that the first operation (e.g., pressing of the first belt portion) has been performed, the control unit outputs a first operation signal to the GUI controller (S63). The first operation signal is an operation signal to designate downward scroll on a browser screen or an operation signal to designate downward movement of a pointer. When determining that the second operation (e.g., pressing of the second band portion) has been performed, the control unit outputs a second operation signal to the GUI controller (S64). The second operation signal is an operation signal to designate upward scroll on the browser screen or an operation signal to designate upward movement of the pointer.

As described above, the operation input device according to the fifth example of the present invention can be provided with the GUI operation function.

Next, a description will be given of a sixth example of the control flow applicable to the operation input device shown in each of the foregoing embodiments.

Figure 20:
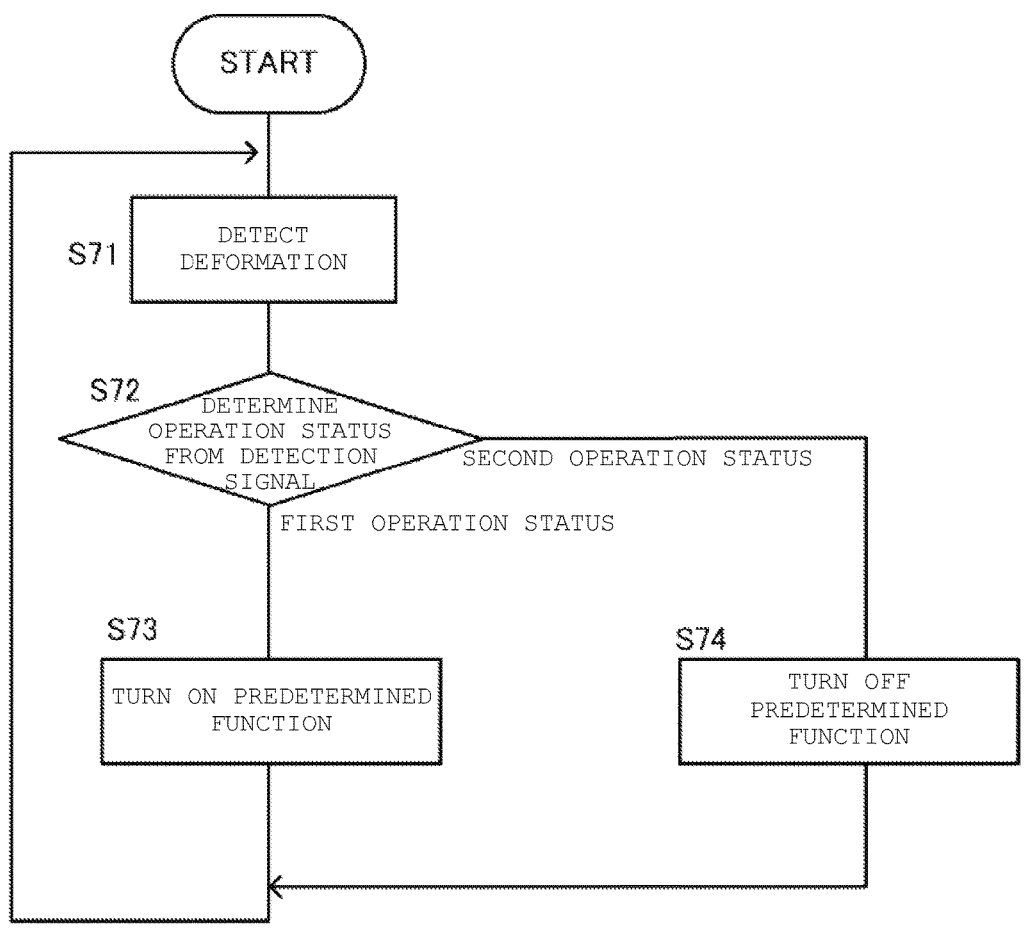
FIG. 20 is a diagram showing a control flow in a sixth example of the operation input device according to the present invention.

FIG. 20 is a control flow in the case of providing the operation input device with a call function.

In the operation input device having been started in a call mode connected with a line of contact, when a predetermined external force is applied to the exterior portion and deformation occurs in the band portion and the detection portion, a detection signal from the deformation detection unit is inputted into the control unit (S71).

The control unit determines the state of operation being operated by the operator based on the relation between the polarity of the potential difference from the reference potential in the detection signal and the appropriate threshold (S72). The determination of the operation state is, for example, determination as to whether the band portion remains in a held state or not in the held state. While the line of contact remains connected, the control unit switches the on-off of a predetermined function in accordance with the determined operation state (S73, S74). For example, when the band portion is in the held state, a microphone is turned on to transmit utterance of the user through the line of contact, and when the band portion is not in the held state, the microphone is turned off not to transmit utterance of the user through the line of contact. Further, for example, when the band portion is in the held state, a record function is turned on, and when the band portion is not in the held state, the record function is turned off.

As described above, the operation input device according to the sixth example of the present invention can easily operate a variety of functions related to call.

Next, a description will be given of a seventh example of the control flow applicable to the operation input device shown in each of the foregoing embodiments.

Figure 21:
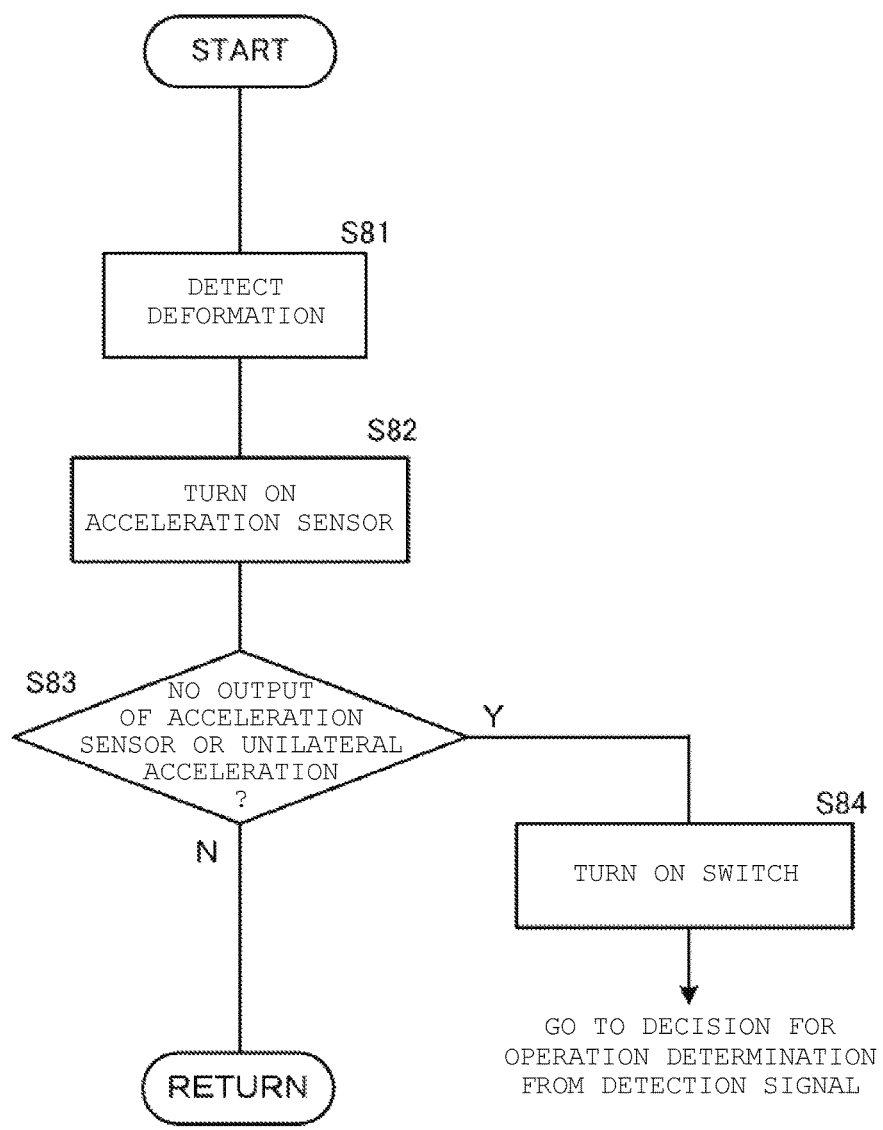
FIG. 21 is a diagram showing a control flow in a seventh example of the operation input device according to the present invention.

FIG. 21 is a diagram showing a control flow in the seventh example of the operation input device according to the present invention. In the seventh example, the operation input device includes both the deformation detection unit and the acceleration sensor. For this reason, the operation input device can detect whether or not the operator has applied a pressing force with the intention. This is because, as described above, the deformation detection unit has the possibility to bring about malfunction due to an unintended shake of the band portion. Examples of the unintended shake of the band portion include a swing of the arm at the time when the operator walks wearing the watch, and vibration at the time when the operator walks holding a bag with the watch therein.

Speaking in detail, in the operation input device having been started in a switching mode between the display-on state and the display-off state, when a predetermined external force is applied to the exterior portion and deformation occurs in the band portion and the deformation detection unit, a detection signal from the deformation detection unit is inputted into the control unit (S81).

The control unit turns on the acceleration sensor (S82). As thus described, by turning on the acceleration sensor at a point in time when the deformation detection unit detects a pressing force, the operation input device does not need to regularly operate the acceleration sensor. Hence the operation input device can reduce the power consumption.

The control unit then determines whether or not output of the acceleration sensor which is not smaller than a threshold can be confirmed for a predetermined time (e.g. 5 sec.), or whether or not output of the acceleration sensor shows unilateral acceleration (S83). In S83, the control unit detects whether or not the operator is moving. This decision is made on the assumption that pressing force in a state where the output from the acceleration sensor cannot be confirmed, or pressing force in the state of unilateral acceleration, is applied in the scene of the operator stopping and intentionally pushing the pressing sensor.

When the output of the acceleration sensor can be confirmed during the predetermined time and the output of the acceleration sensor does not show unilateral acceleration (or shows acceleration not smaller than the certain threshold), the control unit returns to S81 and continues the processing. This flow is made assuming a scene where a detection signal is inputted from the deformation detection unit due to an unintended shake of the band portion. Hence the operation input device can be prevented from bringing about malfunction due to an unintended shake of the band portion.

Meanwhile, when the output of the acceleration sensor cannot be confirmed during the predetermined time, or when the output of the acceleration sensor shows unilateral acceleration, the control unit turns on the display unit in the case of the current state being not the displaying state (S84).

Then, the control unit goes to a decision for the operation determination shown in S12, S42, S62, S72, or the like, for example.

Next, a description will be given of an eighth example of the control flow applicable to the operation input device shown in each of the foregoing embodiments.

Figure 22:
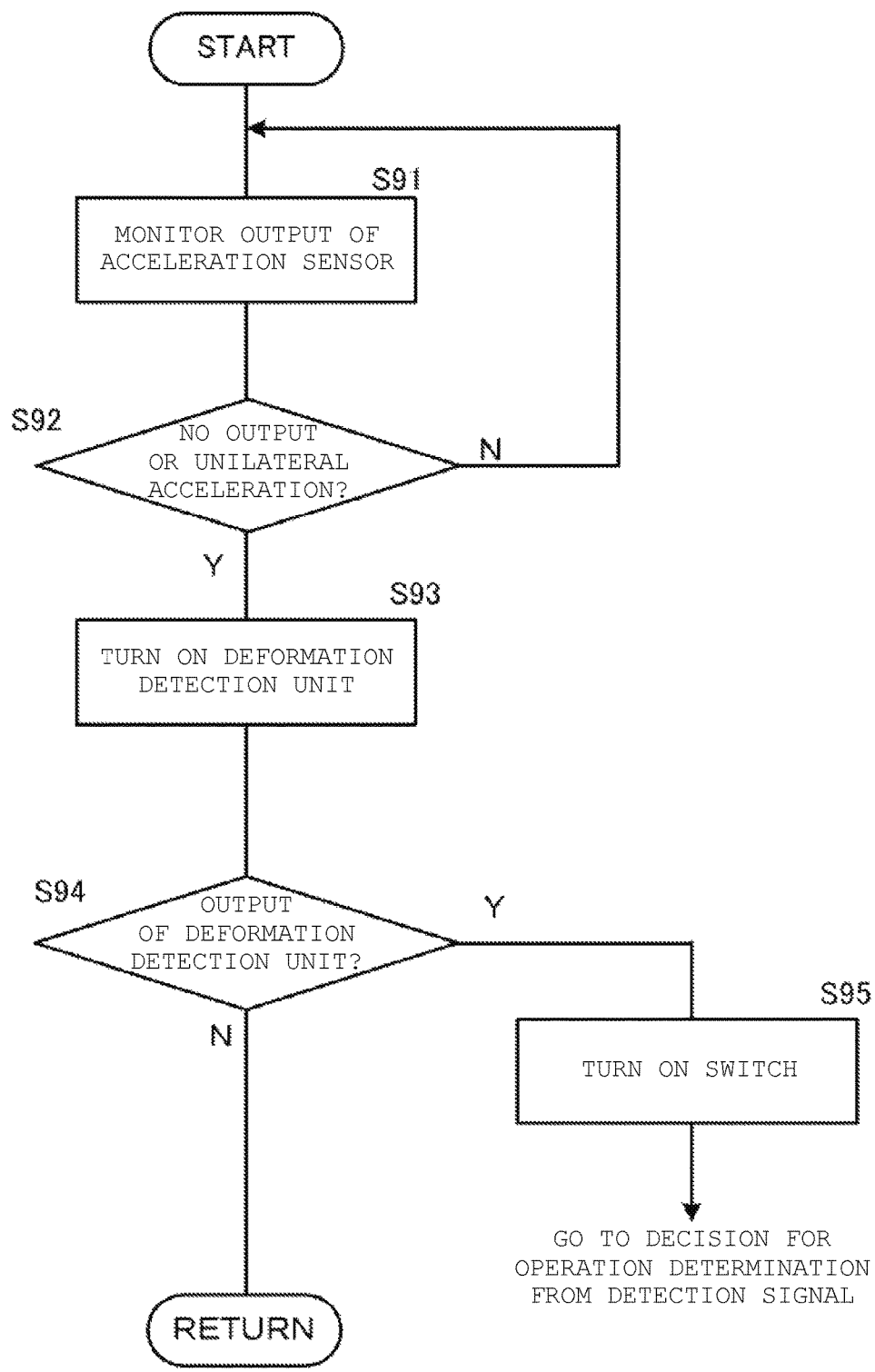
FIG. 22 is a diagram showing a control flow in an eighth example of the operation input device according to the present invention.

FIG. 22 is a diagram showing a control flow in the eighth example of the operation input device according to the present invention. In the eighth example, the operation input device includes both the deformation detection unit and the acceleration sensor. For this reason, the operation input device can detect whether or not the operator has applied a pressing force with the intention. This is because, as described above, the deformation detection unit has the possibility to bring about malfunction due to an unintended shake of the band portion. Examples of the unintended shake of the band portion include a swing of the arm at the time when the operator walks wearing the watch, and vibration at the time when the operator walks holding a bag with the watch therein.

Speaking in detail, in the operation input device having been started in a switching mode between the display-on state and the display-off state, the control unit monitors output of the acceleration sensor (S91).

The control unit determines whether or not output of the acceleration sensor which is not smaller than a threshold can be confirmed for a predetermined time (e.g. 5 sec.), or whether or not output of the acceleration sensor shows unilateral acceleration (S92). In S92, the control unit detects whether or not the operator is moving. This decision is made on the assumption that pressing force in a state where the output from the acceleration sensor cannot be confirmed, or pressing force in the state of unilateral acceleration, is applied in the scene of the operator stopping and intentionally pushing the pressing sensor.

When the output of the acceleration sensor can be confirmed during the predetermined time (or shows acceleration not smaller than the certain threshold) and the output of the acceleration sensor does not show unilateral acceleration, the control unit returns to S91 and continues the processing. This flow is made assuming a scene where a detection signal is inputted from the deformation detection unit due to an unintended shake of the band portion. Hence the operation input device can be prevented from bringing about malfunction due to an unintended shake of the band portion.

Meanwhile, when the output of the acceleration sensor cannot be confirmed during the predetermined time, or when the output of the acceleration sensor shows unilateral acceleration, the control unit turns on the deformation detection unit (S93). As thus described, by turning on the deformation detection unit after determination of the output of the acceleration sensor by the control unit, the operation input device does not need to regularly operate the deformation detection unit. Hence the operation input device can reduce the power consumption.

The control unit then confirms output of the deformation detection unit (S94).

When a detection signal from the deformation detection unit is not inputted into the control unit, the control unit returns to S91 and continues the processing.

Meanwhile, when a detection signal from the deformation detection unit is inputted into the control unit, the control unit turns on the display unit in the case of the current state being not the displaying state (S95). This processing is on the assumption of a scene where a predetermined external force is applied to the exterior portion to cause occurrence of deformation in the band portion and the deformation detection unit.

Here, the modes of FIGS. 21 and 22 are basically on the assumption of a scene where the operator intends to perform operation only while stopping. Thus, for example when the operator intends to perform operation while shaking the arm mounted with the watch, the operator may turn off these modes, or may set a threshold so as to be able to perform operation so long as shaking the arm to some extent.

Although the information terminal includes the acceleration sensor in the above embodiment, this is not restrictive. In implementation, the information terminal may include a sensor other than the acceleration sensor. This sensor is, for example, an angular velocity sensor, a capacitance sensor, a temperature sensor, an ultrasonic sensor, an optical sensor, or a $CO_2$ sensor. In the optical sensor, inspection is performed by visual light or infrared light, for example.

How to use the angular velocity sensor is basically the same as how to use the acceleration sensor. However, since the angular velocity sensor can detect rotation, the information terminal may turn on the deformation detection unit 3 at a point in time when the angular velocity sensor detects movement of the operator turning the arm to view the display screen.

Alternatively, the information terminal may turn on the deformation detection unit 3 at a point in time when the capacitance sensor detects a touch by the finger. On the contrary, the information terminal may detect whether the finger is giving a push after the capacitance sensor is turned on at the point in time of detecting a pressing force to the deformation detection unit 3, or deformation caused by a push has occurred due to unexpected application of a load on the first belt portion 13 or the second belt portion 14.

Alternatively, the information terminal may turn on the deformation detection unit 3 at a point in time when the temperature sensor detects a temperature of the finger at the time of its touch or, on the contrary, may turn on the temperature sensor at a point in time of detecting the pressing force to the deformation detection unit 3, to detect whether the finger is giving a push. In this case, no reaction occurs even when a pressing force is applied by a matter other than a finger (a matter with a temperature not as high as that of a finger), and there is thus an advantage in being able to reduce erroneous detection.

Although the information terminal includes one acceleration sensor, this is not restrictive. In implementation, the information terminal may include a plurality of sensors to further reduce erroneous detection.

The operation input device of the present invention can be implemented as shown in each of the above embodiments and examples. Note that the operation input device of the present invention is not restricted to the above embodiments or examples, but an appropriate configuration and control can be adopted so long as being within the range of the configuration recited in the claims. For example, the operation input device of the present invention may at least include the deformation detection unit, and may be configured by adding a button switch, a touch sensor, a touch panel, or the like other than the deformation detection unit. The control shown in each of the foregoing examples may be achieved by combining a detection signal of the deformation detection unit and a detection signal of the button switch, the touch sensor, the touch panel, or the like.

DESCRIPTION OF REFERENCE SYMBOLS

1, 1D: exterior portion
2: electric module unit 3, 3A, 3C: deformation detection unit
6: acceleration sensor
10, 10A, 10B, 10D: information terminal
11: band portion
12: glass portion
13, 13D: first belt portion
13': first part
14, 14D: second belt portion
14': second part
15, 15D: case portion
16: buckle portion
17: locking hole
18D: projection
19D: depression
21: display
22: power supply
23: control unit
24: housing
31: top face
32: bottom face
33, 34, 33A: piezoelectric film
35, 34A: signal electrode
36, 35A: reference potential electrode

The invention claimed is:

1. An operation input device comprising:
an exterior portion that includes a housing and a band portion extending in a belt shape;
a control unit housed in the exterior portion and programmed to perform processing based on a detection signal; and
a deformation detection unit disposed in one of the band portion and the housing, the deformation detection unit outputting the detection signal associated with a deformation of the band portion or a deformation of the housing to the control unit,
wherein
the exterior portion includes a body portion that is more rigid than the band portion and which houses the control unit, and
the band portion includes:
 a first part adjacent to a first edge of the body portion in an extending direction of the band portion, and
 a second part adjacent to a second edge of the body portion in the extending direction of the band portion, and
the deformation detection unit is attached to the first part of the band portion,
wherein the deformation detection unit is a first deformation detection unit, and the operation input device further comprises a second deformation detection unit attached to the second part of the band portion,
wherein
the first deformation detection unit senses a first form of deformation of the band portion, and
the second deformation detection unit senses the first form of deformation, and
the operation input device further comprises a third deformation detection unit in the first part of the band portion, wherein the third deformation detection unit senses a second form of deformation of the band portion different from the first form of deformation.

2. The operation input device according to claim 1, wherein the deformation detection unit is disposed in the band portion and the detection signal output to the control unit is based on a directionality of the deformation of the band portion.

3. The operation input device according to claim 1, wherein
the deformation detection unit includes a piezoelectric film configured to deform in a stretching or contracting direction due to deformation of the band portion so as to generate a charge, and
the piezoelectric film is disposed and wired so as to sense a bending deformation of the band portion.

4. The operation input device according to claim 3, wherein the piezoelectric film extends in a direction away from the body portion, and has a length larger than 5 mm.

5. The operation input device according to claim 4, wherein the length of the piezoelectric film is from 7 mm to 31 mm.

6. The operation input device according to claim 4, wherein the length of the piezoelectric film is from 15 mm to 25 mm.

7. The operation input device according to claim 1, wherein
the deformation detection unit includes a piezoelectric film that configured to deform in a stretching or contracting direction due to deformation of the band portion so as to generate a charge, and
the piezoelectric film is disposed and wired so as to sense a twisting deformation around a lengthwise axis of the band portion.

8. The operation input device according to claim 1, wherein the deformation detection unit is disposed in both of the housing and the band portion.

9. The operation input device according to claim 1, wherein
the housing has a bottom face and a side face, and
the deformation detection unit is provided on the side face.

10. The operation input device according to claim 1, further comprising:
an acceleration sensor that detects whether or not the operation input device is in motion,
wherein the control unit is constructed to turn on the acceleration sensor based on output of the deformation detection unit.

11. The operation input device according to claim 1, further comprising:
an acceleration sensor that detects whether or not the operation input device is in motion,
wherein the control unit is constructed to turn on the deformation detection unit based on output of the acceleration sensor.

12. An operation input device comprising:
an exterior portion that includes a housing and a band portion extending in a belt shape;
a control unit housed in the exterior portion and programmed to perform processing based on a detection signal; and
a deformation detection unit disposed in one of the band portion and the housing, the deformation detection unit outputting the detection signal associated with a deformation of the band portion or a deformation of the housing to the control unit, wherein
the exterior portion includes a body portion that is more rigid than the band portion and which houses the control unit, and
the band portion includes:
 a first part adjacent to a first edge of the body portion in an extending direction of the band portion, and a second part adjacent to a second edge of the body portion in the extending direction of the band portion, and the deformation detection unit is attached to the first part of the band portion, and wherein the deformation detection unit is a first deformation detection unit, and the operation input device further comprises a second deformation detection unit attached to the second part of the band portion; and the operation input device further comprises:

a third deformation detection unit in the first part of the band portion, wherein the first deformation detection unit senses a first form of deformation of the band portion, and the third deformation detection unit senses a second form of deformation of the band portion different from the first form of deformation.

\* \* \* \* \*